United States Patent [19]

Scott

[11] 4,409,587
[45] Oct. 11, 1983

[54] ALTIMETER CODE CONVERTER

[75] Inventor: Robert G. Scott, Quincy, Mass.

[73] Assignee: The United States of America as represented by the Secretary of the Air Force, Washington, D.C.

[21] Appl. No.: 343,031

[22] Filed: Jan. 27, 1982

[51] Int. Cl.³ .......................................... H03K 13/24
[52] U.S. Cl. .......................... 340/347 DD; 244/180; 371/49
[58] Field of Search ........ 340/347 M, 347 CC, 347 P, 340/347 AD; 250/231 SE; 235/92 MP; 244/180-182; 371/49

[56] References Cited

U.S. PATENT DOCUMENTS

| | | | |
|---|---|---|---|
| 3,631,468 | 12/1971 | Spaid | 340/347 AD |
| 3,675,236 | 7/1972 | Shoap | 340/347 DD |
| 3,738,504 | 6/1973 | Vail et al. | 340/347 M X |
| 3,824,587 | 7/1974 | Fowler | 340/347 P |
| 3,889,104 | 6/1975 | Smith | 235/150.2 |
| 4,023,144 | 5/1977 | Koenig | 340/172.5 |
| 4,039,806 | 8/1977 | Fredriksson et al. | 340/347 AD X |
| 4,086,580 | 4/1978 | Schroeder | 235/92 MP X |

OTHER PUBLICATIONS

The Engineering Staff of Analog Devices, Inc., Analog-Digital Conversion Handbook, 6/1972, pp. I-1 to I-11; I-64 & 65; II-32 & II-33; II-80 & II-81.
Intel Component Data Catalog, 1/1981, 2716 Erasable Prom, pp. 2-3.
Kosteva, Error Detection Circuit, IBM Technical Disclosure Bulletin, vol. 3, No. 10, 3/1961, pp. 47 & 48.

*Primary Examiner*—T. J. Sloyan
*Attorney, Agent, or Firm*—Donald J. Singer; Stanton E. Collier

[57] ABSTRACT

An altimeter code converter that converts a parallel signal of a first code to a serial signal of a second code; The code converter of this invention includes a code conversion means having memory means with an addressable look-up table to convert Gray code to a binary code; a data conversion means having parallel-to-series shift registers connected in series and a flip-flop parity generator for converting the parallel signal to a serial signal; and operably connected to the above means are means for forming and outputting timing and initializing signals.

3 Claims, 9 Drawing Figures

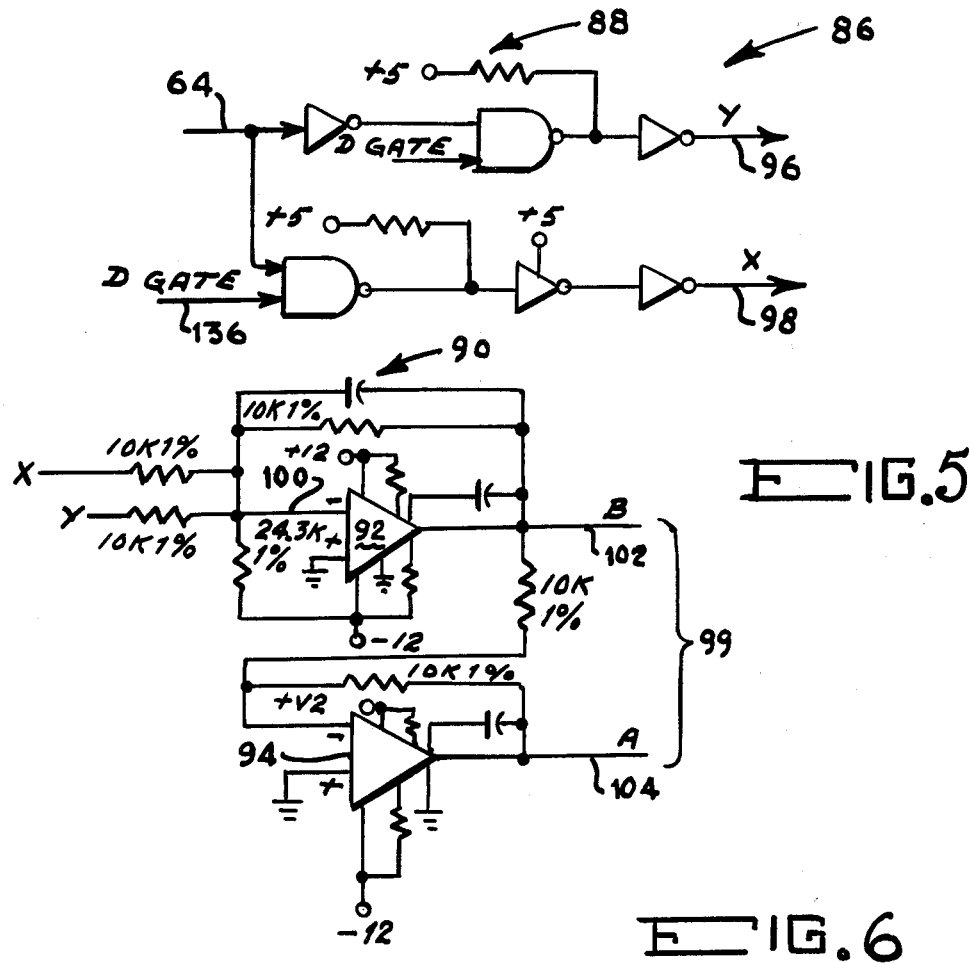
FIG. 5
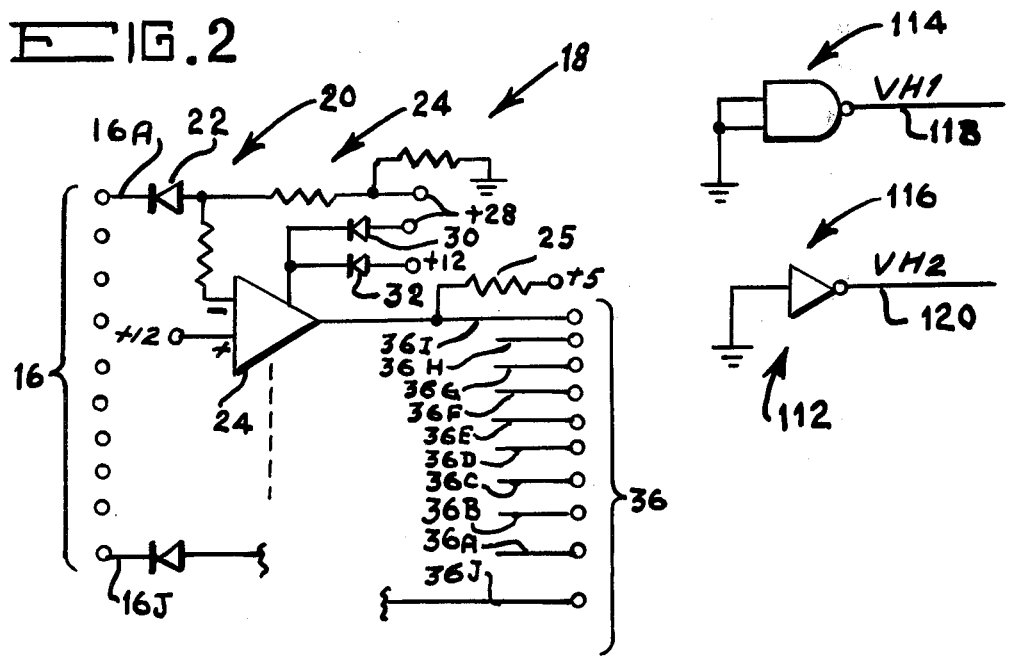
FIG. 6
FIG. 2

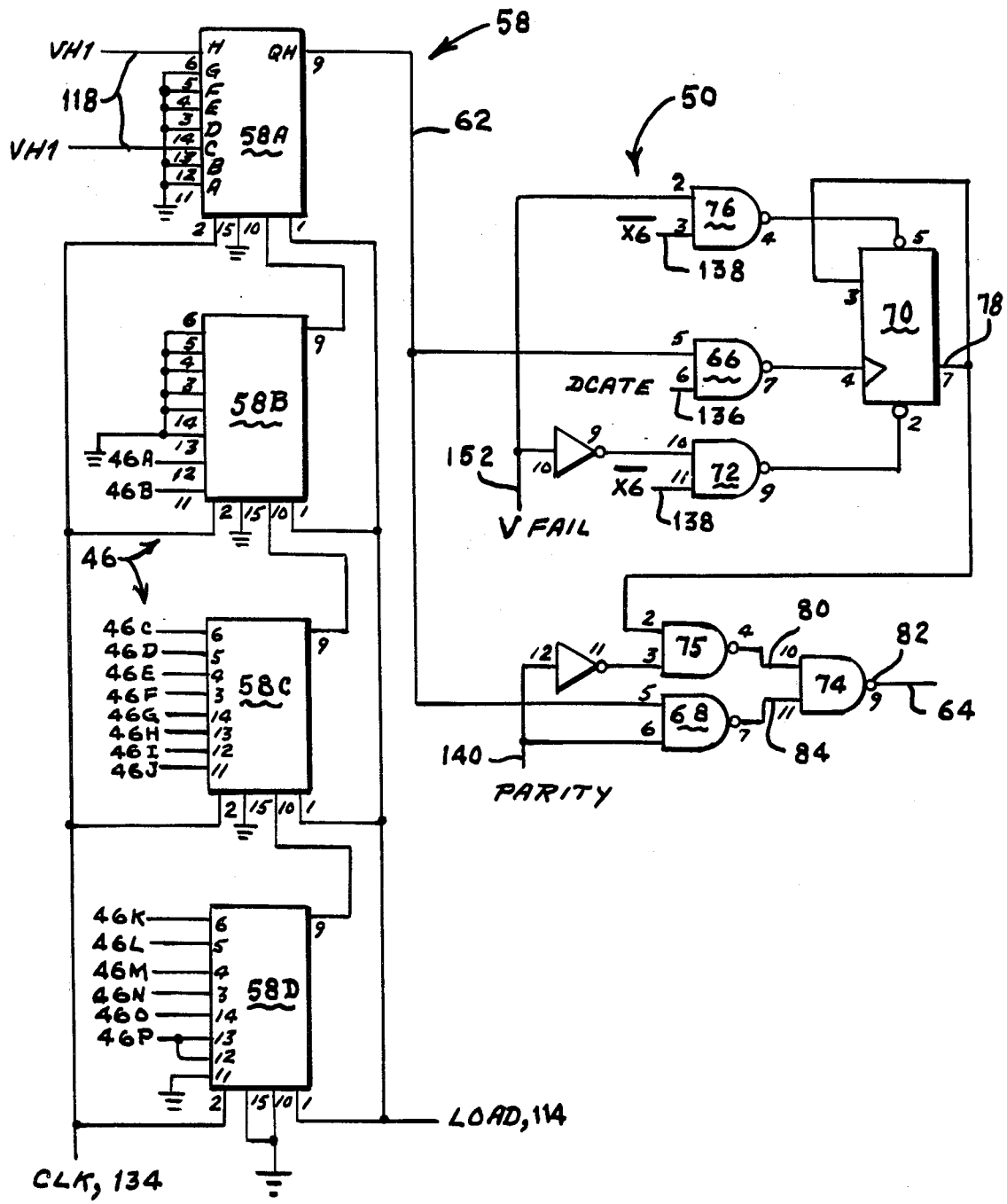

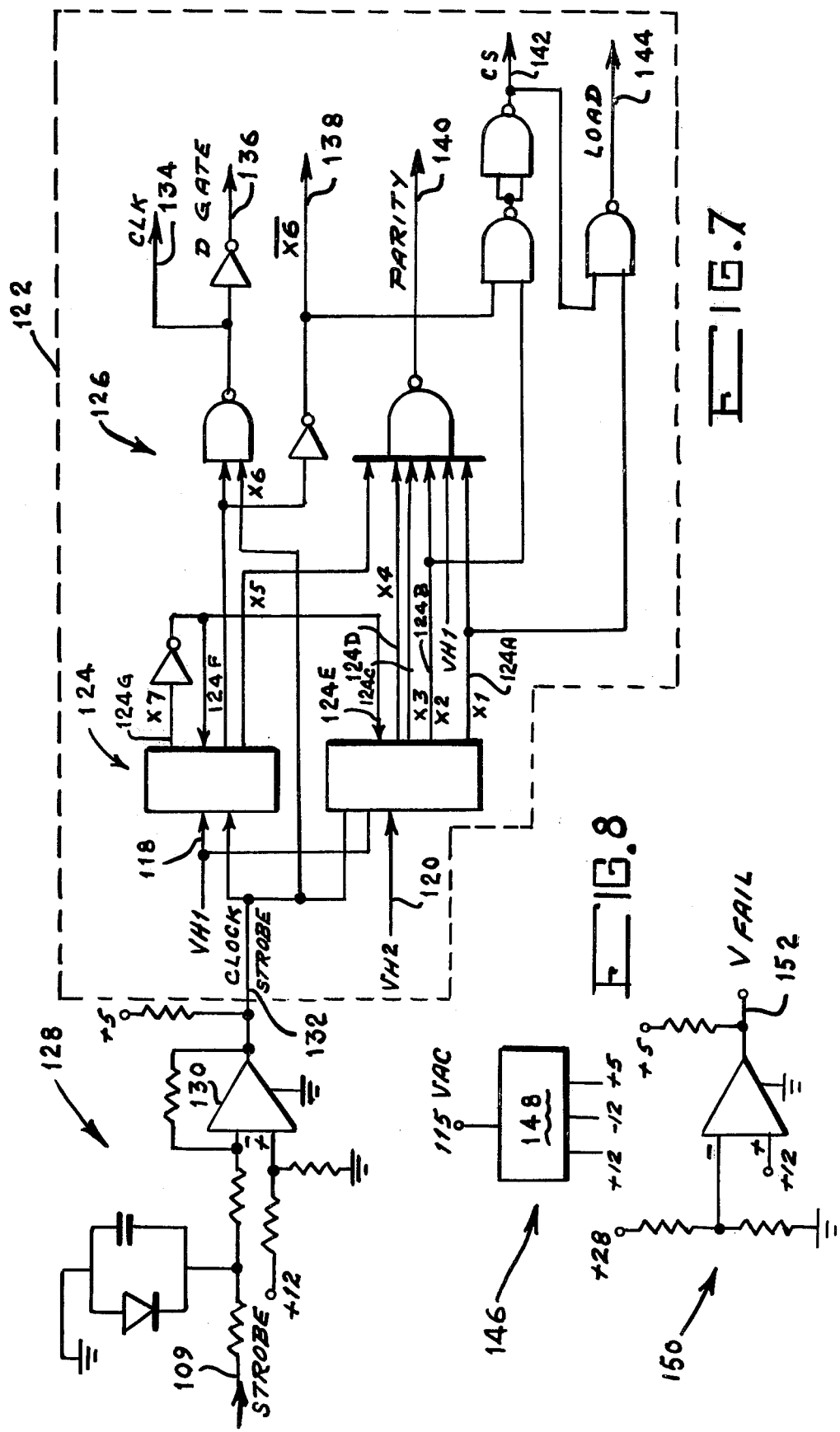

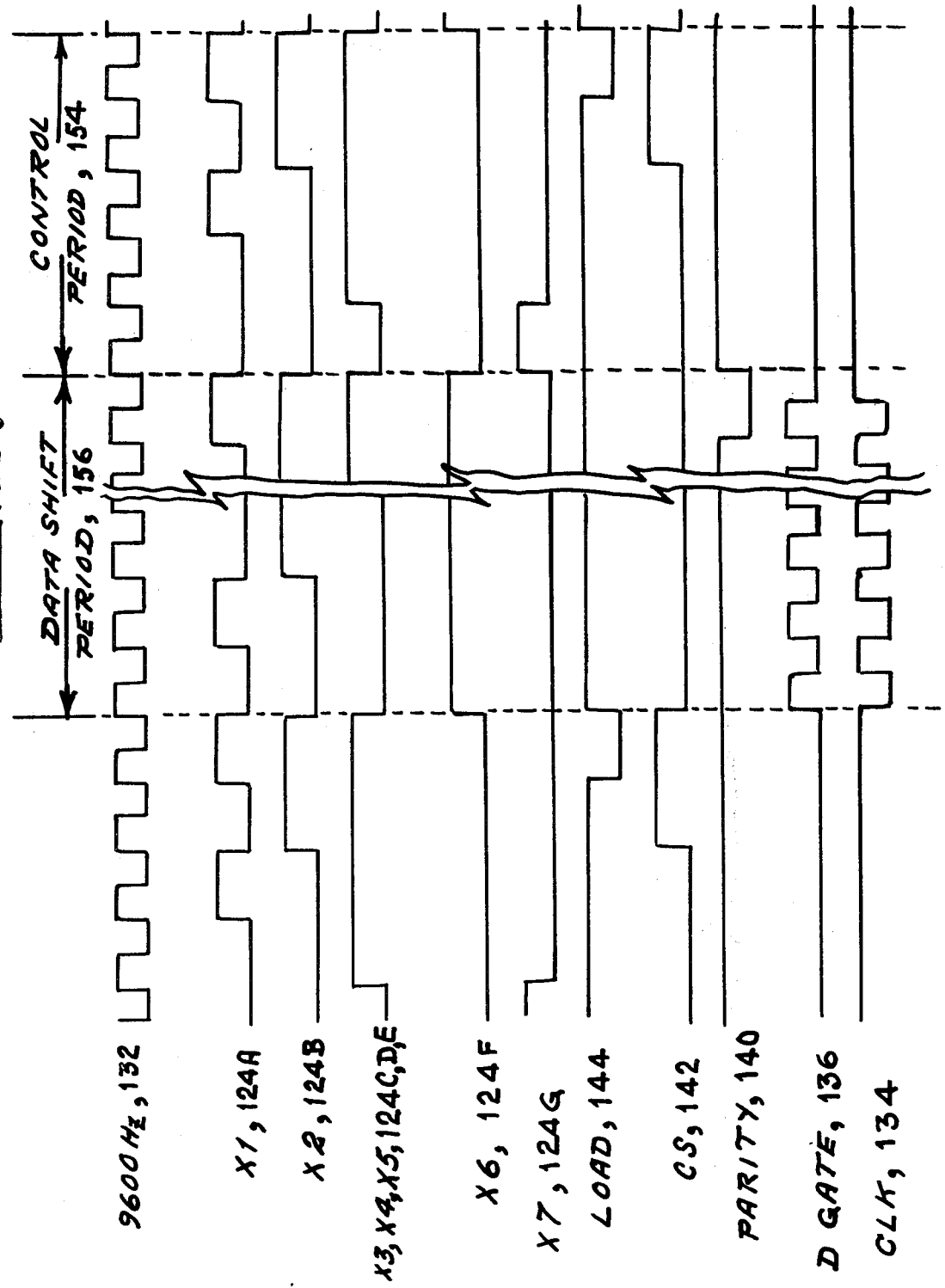

ALTIMETER CODE CONVERTER

STATEMENT OF GOVERNMENT INTEREST

The invention described herein may be manufactured and used by or for the Government for governmental purposes without the payment of any royalty thereon.

BACKGROUND OF THE INVENTION

1. Field of the Invention

This invention relates to a parallel to serial code converters for receiving digital information in parallel form and transmitting it in serial form, and in particular, to an altimeter code converter that converts parallel Gray code to serial binary code.

2. Description of the Prior Art

One method of obtaining a parallel-to-serial conversion is by use of shift registers and a general purpose computer. The shift registers convert the parallel Gray code to a serial Gray code that is input to a computer having an algorithm that converts the serial Gray code altimeter information into serial binary code having the same information. This information is then processed by other devices requiring a serial binary input for display, et cetera.

The Gray code output of the altimeter is divided into two sections, the seven high order bits which designate the altitude in 500 foot increments and the three low order bits, which when properly decoded, represent 100 foot increments. Straight Gray code to binary code is not possible for two reasons. First, the zero Gray code output of the altimeter represents an altitude of −1000 feet which means some arithmetic or special decoding has to be performed in order to obtain the correct altitude in 500 foot increments. Second, because the three low order bits represent the altitude in 100 foot increments special decoding would also be necessary to determine whether 0, 100 or 200 feet should be added or subtracted to the corrected 500 foot increment.

Although the above devices accomplish the intended purpose, it is extremely expensive because of the use of a general purpose computer and the required programming associated therewith. Additionally, a non-controllable time delay occurs because of the general purpose computer as the data flow is governed by the computer's conversion time. Therefore, it is clearly evident that a converter which is not only less expensive to produce and operate than converters of the past, but also operating at a greater operating speed would be highly desirable.

SUMMARY OF THE INVENTION

This invention converts a parallel signal having Gray code data therein received from an altimeter to a serial signal having binary code data therein. The converter in effect changes a parallel signal to a serial signal and changes the code of the data therein. The serial signal is input into a computer for processing and thereby overcomes the problems set forth hereinabove.

The device of the present invention includes therein essentially memory means for code conversion and shift registers for parallel-to-serial signal conversion. The parallel signal output from the altimeter is input to the parallel address inputs of a memory means such as a read-only-memory device (ROM). Each parallel signal addresses one memory location in the ROM wherein an altitude coded in binary is stored. This binary altitude information is then output on the parallel outputs of the ROMs and input to shift registers that serialize the parallel signal. This device has also input and output data interfaces and data control circuits. These latter devices condition the data for processing and sequence the data through the altimeter code converter.

One object of this invention is to provide a code converter designed to convert a parallel signal to a serial signal and change codes of the data therein.

Another object of this invention is to provide a code converter that minimizes cost by utilizing inexpensive components.

Another object of this invention is to provide a code converter having an output data rate dependent upon an external clocking signal considering the cumulative propagation delays of the individualized components as the limiting factor.

A further object of this invention is to provide a code converter that converts parallel Gray code data to Digital Air Data System (DADS) code for input to a Delco Carousel IV Computer.

Other objects, advantages, and novel features of the invention will become apparent from the following detailed description when considered in conjunction with the claims and the accompanying drawings.

BRIEF DESCRIPTION OF THE DRAWINGS

FIG. 2 is a schematic diagram of an input data interface of FIG. 1;

FIG. 4 is a schematic diagram of a data conversion device of FIG. 1;

FIG. 5 is a schematic diagram of an output data interface of FIG. 1;

FIG. 6 is a schematic diagram of preset devices of FIG. 1;

FIG. 7 is a schematic diagram of a data control device of FIG. 1;

FIG. 8 is a schematic diagram of power supply means of FIG. 1; and

FIG. 9 is a timing diagram illustrating various signals of FIG. 1.

DETAILED DESCRIPTION OF THE PREFERRED EMBODIMENT

The code converter of this invention performs code conversion by use of memory means with a conversion table stored therein and performs signal conversion by use of parallel-to-series shift register means.

Figure 1:
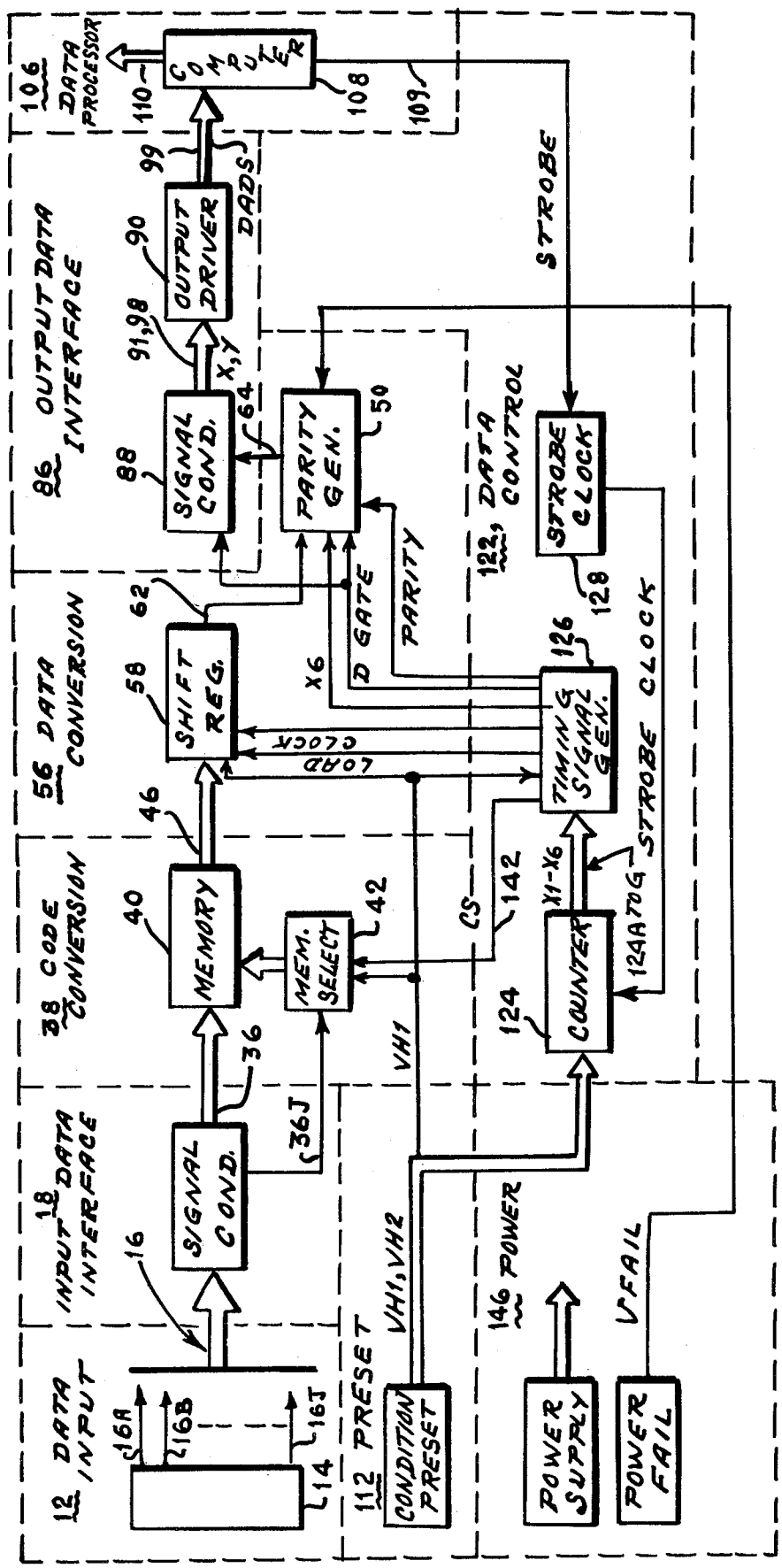
FIG. 1 is a functional block diagram of the altimeter code converter.

Referring to FIG. 1, a data input device 12 such as a conventional altimeter 14 outputs a ten bit parallel signal 16 of Gray code to a data interface device 18 that is of conventional design. Data interface device 18 outputs an adjusted parallel signal 36 to the code converter of this invention. Code conversion device 38 outputs a sixteen bit parallel signal 46 of binary code to a data conversion device 56 that outputs a thirty-two bit serial signal 62 of binary code to an output data interface device 86 of conventional design that outputs an adjusted serial signal 99 of binary code to a data processing device 106 such as a conventional computer 108. A data control device 122 and a preset device 112 of the code converter provide initializing and timing signals to the above noted devices to sequence the data from the altimeter to computer 108. A power means 146 provides regulated voltages to the various devices and outputs a voltage failure signal so as to flag invalid information flowing to computer 108.

As to data input device 12, altimeter 14 outputs ten bits of Gray code data in a first code on parallel signal 16. The Gray code word is composed of ten bits being divided between two fields wherein the first field has three low order bits addressed as A1, A2, and A4 representing 100 foot increments and transmitted on bit signals 16A, 16B, and 16C respectively; and the second field has seven bits addressed as B1, B2, B4, C1, C2, C4 and D5 representing the altitude in 500 foot increments and transmitted on bit signals 16D, 16E, 16F, 16G, 16H, 16I, and 16J respectively. Parallel signal 16 is input to input data interface 18.

Referring to FIG. 2, input data interface 18 includes isolating means 20 such as diode 22 that isolates the code converter from other equipment using altimeter 14, and minimum loading means 24 to reduce the current load on altimeter 14.

For example, this invention uses three LM 139 quad comparators having 4 operational amplifiers 24 per LM 139 to interface bit signals 16A to 16J to memory device 40. An equal number of isolating diodes 22 are also utilized. Each operational amplifier 24 is used to minimize loading. A pull-up resistor 25 is used on the output of operational amplifier 24 for adjusting the voltage output level between 0 and +5 volts. Each bit signal, 16A to 16J, corresponding to Gray code bit addresses previously noted, is applied to one set of isolating and minimizing means. Adjusted parallel signal 36 of data interface 18 is composed of adjusted bit signals 36A to 36J. Table I summarizes corresponding addresses and signals.

TABLE I

| ADDRESS | BIT SIG. | ADJ. BIT SIG. |
|---------|----------|---------------|
| A1 | 16A | 36I |
| A2 | 16B | 36H |
| A4 | 16C | 36G |
| B1 | 16D | 36F |
| B2 | 16E | 36E |
| B4 | 16F | 36D |
| C1 | 16G | 36C |
| C2 | 16H | 36B |
| C4 | 16I | 36A |
| D5 | 16J | 36J |

Figure 3:
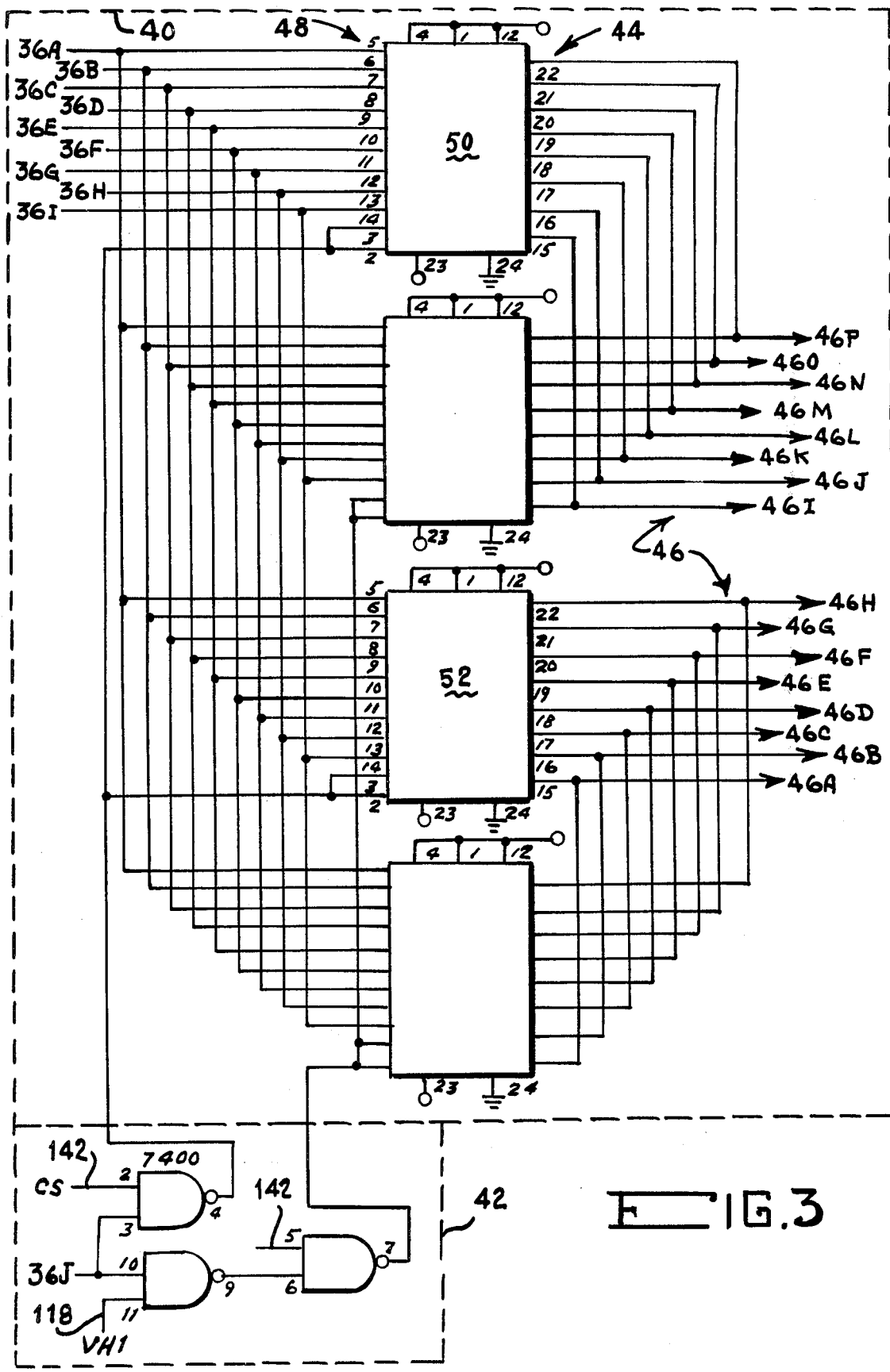
FIG. 3 is a schematic diagram of a code conversion device of FIG. 1.

Referring to FIG. 3, adjusted parallel signal 36, composed of bit signals 36A to 36I is applied to parallel address inputs 48 of ROMS 44 of memory device 40.

In this embodiment, Gray code data is converted to binary code data. A computer is programmed to take each unique Gray code word having ten bits and changing the first code to a second code being binary. Over 600 separate conversions are needed to decode Gray code altitude between −1000 feet and 62,400 feet in 100 foot increments. The resulting binary word is of necessity sixteen bits long.

Table II depicts information input, stored, and output from memory means 40. Column 1 is the word location number in memory. Column 2 is a sequential list of each particular Gray code in hexidecimal or the address needed to reach a corresponding word location. Column 3 is the binary hexidecimal representation of the corresponding Gray code. Column 4 is the elevation in feet. Column 5 shows how column 2, Gray code hexidecimal number, is obtained. For example, word 45, Gray code number 29, corresponds to an altitude of 1800 feet represented as 01C2A in binary hexidecimal stored therein.

Table III is a memory map of memory means 40 when Gray code is converted to binary in the altitude range noted in Table II.

TABLE II

```
 1 0000                                                            00000010
 2 0000                                                            00000020
 3 0000 0000 A                                                     00000030
 4 0000 0000 A    .WORD     0/4      ;0 000000000000000            00010000
 5 0001 0000 A    .WORD     0/4      ; 1                           00010001
 6 0002 FF06 A    .WORD  -1000/4     ; 2                           00010002
 7 0003 0000 A    .WORD     0/4      ; 3                           00010003
 8 0004 FF38 A    .WORD   -800/4     ;  4                          00010004
 9 0005 0000 A    .WORD     0/4      ;   5                         00010005
10 0006 FF1F A    .WORD   -900/4     ;    6                        00010006
11 0007 0000 A    .WORD     0/4      ;     7                       00010007
12 0008 0000 A    .WORD     0/4      ;      8                      00010008
13 0009 FFB5 A    .WORD   -300/4     ;       9                     00010009
14 000A FF83 A    .WORD   -500/4     ;        A                    00010010
15 000B FF9C A    .WORD   -400/4     ;         B                   00010011
16 000C FF51 A    .WORD   -700/4     ;          C                  00010012
17 000D 0000 A    .WORD     0/4      ;           D                 00010013
18 000E FF6A A    .WORD   -600/4     ;            E                00010014
19 000F 0000 A    .WORD     0/4      ;             F               00010015
20 0010 0000 A    .WORD     0/4      ;0 111111111111111            00010016
21 0011 00AF A    .WORD    700/4     ; 1                           00010017
22 0012 0070 A    .WORD    500/4     ; 2                           00010018
23 0013 0096 A    .WORD    600/4     ; 3                           00010019
24 0014 004B A    .WORD    300/4     ;  4                          00010020
25 0015 0000 A    .WORD     0/4      ;   5                         00010021
26 0016 0064 A    .WORD    400/4     ;    6                        00010022
27 0017 0000 A    .WORD     0/4      ;     7                       00010023
28 0018 0000 A    .WORD     0/4      ;      8                      00010024
```

```
29 0019 FFCE A      .WORD     -200/4    ;       9                        00010025
30 001A 0000 A      .WORD        0/4    ;        A                       00010026
31 001B FFE7 A      .WORD     -100/4    ;         B                      00010027
32 001C 0032 A      .WORD      200/4    ;          C                     00010028
33 001D 0000 A      .WORD        0/4    ;           D                    00010029
34 001E 0019 A      .WORD      100/4    ;            E                   00010030
35 001F 0000 A      .WORD        0/4    ;             F                  00010031
36 0020 0000 A      .WORD        0/4    ;0 22222222222222                 00010032
37 0021 02A3 A      .WORD     2700/4    ; 1                              00010033
38 0022 0271 A      .WORD     2500/4    ;  2                             00010034
39 0023 028A A      .WORD     2600/4    ;   3                            00010035
40 0024 023F A      .WORD     2300/4    ;    4                           00010036
41 0025 0000 A      .WORD        0/4    ;     5                          00010037
42 0026 0258 A      .WORD     2400/4    ;      6                         00010038
43 0027 0000 A      .WORD        0/4    ;       7                        00010039
44 0028 0000 A      .WORD        0/4    ;        8                       00010040
45 0029 01C2 A      .WORD     1800/4    ;         9                      00010041
46 002A 01F4 A      .WORD     2000/4    ;          A                     00010042
47 002B 01DB A      .WORD     1900/4    ;           B                    00010043
48 002C 0226 A      .WORD     2200/4    ;            C                   00010044
49 002D 0000 A      .WORD        0/4    ;             D                  00010045
50 002E 020D A      .WORD     2100/4    ;              E                 00010046
51 002F 0000 A      .WORD        0/4    ;               F                00010047
52 0030 0000 A      .WORD        0/4    ;0 33333333333333                 00010048
53 0031 00C8 A      .WORD      800/4    ; 1                              00010049
54 0032 00FA A      .WORD     1000/4    ;  2                             00010050
55 0033 00E1 A      .WORD      900/4    ;   3                            00010051
56 0034 012C A      .WORD     1200/4    ;    4                           00010052
57 0035 0000 A      .WORD        0/4    ;     5                          00010053
58 0036 0113 A      .WORD     1100/4    ;      6                         00010054
59 0037 0000 A      .WORD        0/4    ;       7                        00010055
60 0038 0000 A      .WORD        0/4    ;        8                       00010056
61 0039 01A9 A      .WORD     1700/4    ;         9                      00010057
62 003A 0177 A      .WORD     1500/4    ;          A                     00010058
63 003B 0190 A      .WORD     1600/4    ;           B                    00010059
64 003C 0145 A      .WORD     1300/4    ;            C                   00010060
65 003D 0000 A      .WORD        0/4    ;             D                  00010061
66 003E 015E A      .WORD     1400/4    ;              E                 00010062
67 003F 0000 A      .WORD        0/4    ;               F                00010063
68 0040 0000 A      .WORD        0/4    ;0 44444444444444                 00010064
69 0041 068B A      .WORD     6700/4    ; 1                              00010065
70 0042 0659 A      .WORD     6500/4    ;  2                             00010066
71 0043 0672 A      .WORD     6600/4    ;   3                            00010067
72 0044 0627 A      .WORD     6300/4    ;    4                           00010068
73 0045 0000 A      .WORD        0/4    ;     5                          00010069
74 0046 0640 A      .WORD     6400/4    ;      6                         00010070
75 0047 0000 A      .WORD        0/4    ;       7                        00010071
76 0048 0000 A      .WORD        0/4    ;        8                       00010072
77 0049 05AA A      .WORD     5800/4    ;         9                      00010073
78 004A 05DC A      .WORD     6000/4    ;          A                     00010074
79 004B 05C3 A      .WORD     5900/4    ;           B                    00010075
80 004C 060E A      .WORD     6200/4    ;            C                   00010076
81 004D 0000 A      .WORD        0/4    ;             D                  00010077
82 004E 05F5 A      .WORD     6100/4    ;              E                 00010078
83 004F 0000 A      .WORD        0/4    ;               F                00010079
84 0050 0000 A      .WORD        0/4    ;0 55555555555555                 00010080
85 0051 04B0 A      .WORD     4800/4    ; 1                              00010081
86 0052 04E2 A      .WORD     5000/4    ;  2                             00010082
87 0053 04C9 A      .WORD     4900/4    ;   3                            00010083
88 0054 0514 A      .WORD     5200/4    ;    4                           00010084
89 0055 0000 A      .WORD        0/4    ;     5                          00010085
90 0056 04FB A      .WORD     5100/4    ;      6                         00010086
91 0057 0000 A      .WORD        0/4    ;       7                        00010087
92 0058 0000 A      .WORD        0/4    ;        8                       00010088
93 0059 0591 A      .WORD     5700/4    ;         9                      00010089
94 005A 055F A      .WORD     5500/4    ;          A                     00010090
95 005B 0578 A      .WORD     5600/4    ;           B                    00010091
96 005C 052D A      .WORD     5300/4    ;            C                   00010092
97 005D 0000 A      .WORD        0/4    ;             D                  00010093
98 005E 0546 A      .WORD     5400/4    ;              E                 00010094
99 005F 0000 A      .WORD        0/4    ;               F                00010095
100 0060 0000 A     .WORD        0/4    ;0 66666666666666                 00010096
101 0061 02DC A     .WORD     2800/4    ; 1                              00010097
102 0062 02EE A     .WORD     3000/4    ;  2                             00010098
103 0063 02D5 A     .WORD     2900/4    ;   3                            00010099
104 0064 0320 A     .WORD     3200/4    ;    4                           00010100
105 0065 0000 A     .WORD        0/4    ;     5                          00010101
106 0066 0307 A     .WORD     3100/4    ;      6                         00010102
```

```
107 0067 0000 A      .WORD      0/4         ;        7                      00010103
108 0068 0000 A      .WORD      0/4         ;         8                     00010104
109 0069 039D A      .WORD      3700/4      ;          9                    00010105
110 006A 036B A      .WORD      3500/4      ;           A                   00010106
111 006B 0384 A      .WORD      3600/4      ;            B                  00010107
112 006C 0339 A      .WORD      3300/4      ;             C                 00010108
113 006D 0000 A      .WORD      0/4         ;              D                00010109
114 006E 0352 A      .WORD      3400/4      ;               E               00010110
115 006F 0000 A      .WORD      0/4         ;                F              00010111
116 0070 0000 A      .WORD      0/4         ;0   777777777777777            00010112
117 0071 0497 A      .WORD      4700/4      ; 1                             00010113
118 0072 0465 A      .WORD      4500/4      ;  2                            00010114
119 0073 047E A      .WORD      4600/4      ;   3                           00010115
120 0074 0433 A      .WORD      4300/4      ;    4                          00010116
121 0075 0000 A      .WORD      0/4         ;     5                         00010117
122 0076 044C A      .WORD      4400/4      ;      6                        00010118
123 0077 0000 A      .WORD      0/4         ;       7                       00010119
124 0078 0000 A      .WORD      0/4         ;        8                      00010120
125 0079 03B6 A      .WORD      3800/4      ;         9                     00010121
126 007A 03E8 A      .WORD      4000/4      ;          A                    00010122
127 007B 03CF A      .WORD      3900/4      ;           B                   00010123
128 007C 041A A      .WORD      4200/4      ;            C                  00010124
129 007D 0000 A      .WORD      0/4         ;             D                 00010125
130 007E 0401 A      .WORD      4100/4      ;              E                00010126
131 007F 0000 A      .WORD      0/4         ;               F               00010127
132 0080 0000 A      .WORD      0/4         ;0   888888888888888            00010128
133 0081 0E5B A      .WORD      14700/4     ; 1                             00010129
134 0082 0E29 A      .WORD      14500/4     ;  2                            00010130
135 0083 0E42 A      .WORD      14600/4     ;   3                           00010131
136 0084 0DF7 A      .WORD      14300/4     ;    4                          00010132
137 0085 0000 A      .WORD      0/4         ;     5                         00010133
138 0086 0E10 A      .WORD      14400/4     ;      6                        00010134
139 0087 0000 A      .WORD      0/4         ;       7                       00010135
140 0088 0000 A      .WORD      0/4         ;        8                      00010136
141 0089 0D7A A      .WORD      13800/4     ;         9                     00010137
142 008A 0DAC A      .WORD      14000/4     ;          A                    00010138
143 008B 0D93 A      .WORD      13900/4     ;           B                   00010139
144 008C 0DDE A      .WORD      14200/4     ;            C                  00010140
145 008D 0000 A      .WORD      0/4         ;             D                 00010141
146 008E 0DC5 A      .WORD      14100/4     ;              E                00010142
147 008F 0000 A      .WORD      0/4         ;               F               00010143
148 0090 0000 A      .WORD      0/4         ;0   999999999999999            00010144
149 0091 0C80 A      .WORD      12800/4     ; 1                             00010145
150 0092 0CB2 A      .WORD      13000/4     ;  2                            00010146
151 0093 0C99 A      .WORD      12900/4     ;   3                           00010147
152 0094 0CE4 A      .WORD      13200/4     ;    4                          00010148
153 0095 0000 A      .WORD      0/4         ;     5                         00010149
154 0096 0CCB A      .WORD      13100/4     ;      6                        00010150
155 0097 0000 A      .WORD      0/4         ;       7                       00010151
156 0098 0000 A      .WORD      0/4         ;        8                      00010152
157 0099 0D61 A      .WORD      13700/4     ;         9                     00010153
158 009A 0D2F A      .WORD      13500/4     ;          A                    00010154
159 009B 0D48 A      .WORD      13600/4     ;           B                   00010155
160 009C 0CFD A      .WORD      13300/4     ;            C                  00010156
161 009D 0000 A      .WORD      0/4         ;             D                 00010157
162 009E 0D16 A      .WORD      13400/4     ;              E                00010158
163 009F 0000 A      .WORD      0/4         ;               F               00010159
164 00A0 0000 A      .WORD      0/4         ;0   AAAAAAAAAAAAAAA            00010160
165 00A1 0A8C A      .WORD      10800/4     ; 1                             00010161
166 00A2 0ABE A      .WORD      11000/4     ;  2                            00010162
167 00A3 0AA5 A      .WORD      10900/4     ;   3                           00010163
168 00A4 0AF0 A      .WORD      11200/4     ;    4                          00010164
169 00A5 0000 A      .WORD      0/4         ;     5                         00010165
170 00A6 0AD7 A      .WORD      11100/4     ;      6                        00010166
171 00A7 0000 A      .WORD      0/4         ;       7                       00010167
172 00A8 0000 A      .WORD      0/4         ;        8                      00010168
173 00A9 0B6D A      .WORD      11700/4     ;         9                     00010169
174 00AA 0D3B A      .WORD      11500/4     ;          A                    00010170
175 00AB 0B54 A      .WORD      11600/4     ;           B                   00010171
176 00AC 0B09 A      .WORD      11300/4     ;            C                  00010172
177 00AD 0000 A      .WORD      0/4         ;             D                 00010173
178 00AE 0B22 A      .WORD      11400/4     ;              E                00010174
179 00AF 0000 A      .WORD      0/4         ;               F               00010175
180 00B0 0000 A      .WORD      0/4         ;0   BBBBBBBBBBBBBBB            00010176
181 00B1 0C67 A      .WORD      12700/4     ; 1                             00010177
182 00B2 0C35 A      .WORD      12500/4     ;  2                            00010178
183 00B3 0C4E A      .WORD      12600/4     ;   3                           00010179
```

```
184 00D4 0C03 A      .WORD    12300/4    ;          4                    00010180
185 00B5 0000 A      .WORD        0/4    ;           5                   00010181
186 00B6 0C1C A      .WORD    12400/4    ;            6                  00010182
187 00B7 0000 A      .WORD        0/4    ;             7                 00010183
188 00B8 0000 A      .WORD        0/4    ;              8                00010184
189 00B9 0B86 A      .WORD    11800/4    ;               9               00010185
190 00BA 0BB8 A      .WORD    12000/4    ;                A              00010186
191 00BB 0B9F A      .WORD    11900/4    ;                 B             00010187
192 00BC 0BEA A      .WORD    12200/4    ;                  C            00010188
193 00BD 0000 A      .WORD        0/4    ;                   D           00010189
194 00BE 0BD1 A      .WORD    12100/4    ;                    E          00010190
195 00BF 0000 A      .WORD        0/4    ;                     F         00010191
196 00C0 0000 A      .WORD        0/4    ;0 CCCCCCCCCCCCCC               00010192
197 00C1 06A4 A      .WORD     6800/4    ; 1                             00010193
198 00C2 06D6 A      .WORD     7000/4    ;  2                            00010194
199 00C3 06BD A      .WORD     6900/4    ;   3                           00010195
200 00C4 0708 A      .WORD     7200/4    ;    4                          00010196
201 00C5 0000 A      .WORD        0/4    ;     5                         00010197
202 00C6 06EF A      .WORD     7100/4    ;      6                        00010198
203 00C7 0000 A      .WORD        0/4    ;       7                       00010199
204 00C8 0000 A      .WORD        0/4    ;        8                      00010200
205 00C9 0785 A      .WORD     7700/4    ;         9                     00010201
206 00CA 0753 A      .WORD     7500/4    ;          A                    00010202
207 00CB 076C A      .WORD     7600/4    ;           B                   00010203
208 00CC 0721 A      .WORD     7300/4    ;            C                  00010204
209 00CD 0000 A      .WORD        0/4    ;             D                 00010205
210 00CE 073A A      .WORD     7400/4    ;              E                00010206
211 00CF 0000 A      .WORD        0/4    ;               F               00010207
212 00D0 0000 A      .WORD        0/4    ;0 DDDDDDDDDDDDDD               00010208
213 00D1 087F A      .WORD     8700/4    ; 1                             00010209
214 00D2 084D A      .WORD     8500/4    ;  2                            00010210
215 00D3 0866 A      .WORD     8600/4    ;   3                           00010211
216 00D4 081B A      .WORD     8300/4    ;    4                          00010212
217 00D5 0000 A      .WORD        0/4    ;     5                         00010213
218 00D6 0834 A      .WORD     8400/4    ;      6                        00010214
219 00D7 0000 A      .WORD        0/4    ;       7                       00010215
220 00D8 0000 A      .WORD        0/4    ;        8                      00010216
221 00D9 079E A      .WORD     7800/4    ;         9                     00010217
222 00DA 07D0 A      .WORD     8000/4    ;          A                    00010218
223 00DB 07B7 A      .WORD     7900/4    ;           B                   00010219
224 00DC 0802 A      .WORD     8200/4    ;            C                  00010220
225 00DD 0000 A      .WORD        0/4    ;             D                 00010221
226 00DE 07E9 A      .WORD     8100/4    ;              E                00010222
227 00DF 0000 A      .WORD        0/4    ;               F               00010223
228 00E0 0000 A      .WORD        0/4    ;0 EEEEEEEEEEEEEE               00010224
229 00E1 0A73 A      .WORD    10700/4    ; 1                             00010225
230 00E2 0A41 A      .WORD    10500/4    ;  2                            00010226
231 00E3 0A5A A      .WORD    10600/4    ;   3                           00010227
232 00E4 0A0F A      .WORD    10300/4    ;    4                          00010228
233 00E5 0000 A      .WORD        0/4    ;     5                         00010229
234 00E6 0A28 A      .WORD    10400/4    ;      6                        00010230
235 00E7 0000 A      .WORD        0/4    ;       7                       00010231
236 00E8 0000 A      .WORD        0/4    ;        8                      00010232
237 00E9 0992 A      .WORD     9800/4    ;         9                     00010233
238 00EA 09C4 A      .WORD    10000/4    ;          A                    00010234
239 00EB 09AB A      .WORD     9900/4    ;           B                   00010235
240 00EC 09F6 A      .WORD    10200/4    ;            C                  00010236
241 00ED 0000 A      .WORD        0/4    ;             D                 00010237
242 00EE 09DD A      .WORD    10100/4    ;              E                00010238
243 00EF 0000 A      .WORD        0/4    ;               F               00010239
244 00F0 0000 A      .WORD        0/4    ;0 FFFFFFFFFFFFFF               00010240
245 00F1 0898 A      .WORD     8800/4    ; 1                             00010241
246 00F2 08CA A      .WORD     9000/4    ;  2                            00010242
247 00F3 08B1 A      .WORD     8900/4    ;   3                           00010243
248 00F4 08FC A      .WORD     9200/4    ;    4                          00010244
249 00F5 0000 A      .WORD        0/4    ;     5                         00010245
250 00F6 08E3 A      .WORD     9100/4    ;      6                        00010246
251 00F7 0000 A      .WORD        0/4    ;       7                       00010247
252 00F8 0000 A      .WORD        0/4    ;        8                      00010248
253 00F9 0979 A      .WORD     9700/4    ;         9                     00010249
254 00FA 0947 A      .WORD     9500/4    ;          A                    00010250
255 00FB 0960 A      .WORD     9600/4    ;           B                   00010251
256 00FC 0915 A      .WORD     9300/4    ;            C                  00010252
257 00FD 0000 A      .WORD        0/4    ;             D                 00010253
258 00FE 092E A      .WORD     9400/4    ;              E                00010254
259 00FF 0000 A      .WORD        0/4    ;               F               00010255
```

```
260 0100 0000 A        .WORD      0/4         ;0 10 10 10 10 10    00010256
261 0101 1DFB A        .WORD  30700/4         ; 1                  00010257
262 0102 1DC9 A        .WORD  30500/4         ;  2                 00010258
263 0103 1DE2 A        .WORD  30600/4         ;   3                00010259
264 0104 1D97 A        .WORD  30300/4         ;    4               00010260
265 0105 0000 A        .WORD      0/4         ;     5              00010261
266 0106 1DB0 A        .WORD  30400/4         ;      6             00010262
267 0107 0000 A        .WORD      0/4         ;       7            00010263
268 0108 0000 A        .WORD      0/4         ;        8           00010264
269 0109 1D1A A        .WORD  29800/4         ;         9          00010265
270 010A 1D4C A        .WORD  30000/4         ;          A         00010266
271 010B 1D33 A        .WORD  29900/4         ;           B        00010267
272 010C 1D7E A        .WORD  30200/4         ;            C       00010268
273 010D 0000 A        .WORD      0/4         ;             D      00010269
274 010E 1D65 A        .WORD  30100/4         ;              E     00010270
275 010F 0000 A        .WORD      0/4         ;               F    00010271
276 0110 0000 A        .WORD      0/4         ;0 11 11 11 11 11    00010272
277 0111 1C20 A        .WORD  28800/4         ; 1                  00010273
278 0112 1C52 A        .WORD  29000/4         ;  2                 00010274
279 0113 1C39 A        .WORD  28900/4         ;   3                00010275
280 0114 1C84 A        .WORD  29200/4         ;    4               00010276
281 0115 0000 A        .WORD      0/4         ;     5              00010277
282 0116 1C6B A        .WORD  29100/4         ;      6             00010278
283 0117 0000 A        .WORD      0/4         ;       7            00010279
284 0118 0000 A        .WORD      0/4         ;        8           00010280
285 0119 1D01 A        .WORD  29700/4         ;         9          00010281
286 011A 1CCF A        .WORD  29500/4         ;          A         00010282
287 011B 1CE8 A        .WORD  29600/4         ;           B        00010283
288 011C 1C9D A        .WORD  29300/4         ;            C       00010284
289 011D 0000 A        .WORD      0/4         ;             D      00010285
290 011E 1CB6 A        .WORD  29400/4         ;              E     00010286
291 011F 0000 A        .WORD      0/4         ;               F    00010287
292 0120 0000 A        .WORD      0/4         ;0 12 12 12 12 12    00010288
293 0121 1A2C A        .WORD  26800/4         ; 1                  00010289
294 0122 1A5E A        .WORD  27000/4         ;  2                 00010290
295 0123 1A45 A        .WORD  26900/4         ;   3                00010291
296 0124 1A90 A        .WORD  27200/4         ;    4               00010292
297 0125 0000 A        .WORD      0/4         ;     5              00010293
298 0126 1A77 A        .WORD  27100/4         ;      6             00010294
299 0127 0000 A        .WORD      0/4         ;       7            00010295
300 0128 0000 A        .WORD      0/4         ;        8           00010296
301 0129 1B0D A        .WORD  27700/4         ;         9          00010297
302 012A 1ADB A        .WORD  27500/4         ;          A         00010298
303 012B 1AF4 A        .WORD  27600/4         ;           B        00010299
304 012C 1AA9 A        .WORD  27300/4         ;            C       00010300
305 012D 0000 A        .WORD      0/4         ;             D      00010301
306 012E 1AC2 A        .WORD  27400/4         ;              E     00010302
307 012F 0000 A        .WORD      0/4         ;               F    00010303
308 0130 0000 A        .WORD      0/4         ;0 13 13 13 13 13    00010304
309 0131 1C07 A        .WORD  28700/4         ; 1                  00010305
310 0132 1BD5 A        .WORD  28500/4         ;  2                 00010306
311 0133 1BEE A        .WORD  28600/4         ;   3                00010307
312 0134 1BA3 A        .WORD  28300/4         ;    4               00010308
313 0135 0000 A        .WORD      0/4         ;     5              00010309
314 0136 1BBC A        .WORD  28400/4         ;      6             00010310
315 0137 0000 A        .WORD      0/4         ;       7            00010311
316 0138 0000 A        .WORD      0/4         ;        8           00010312
317 0139 1B26 A        .WORD  27800/4         ;         9          00010313
318 013A 1B58 A        .WORD  28000/4         ;          A         00010314
319 013B 1B3F A        .WORD  27900/4         ;           B        00010315
320 013C 1B8A A        .WORD  28200/4         ;            C       00010316
321 013D 0000 A        .WORD      0/4         ;             D      00010317
322 013E 1B71 A        .WORD  28100/4         ;              E     00010318
323 013F 0000 A        .WORD      0/4         ;               F    00010319
324 0140 0000 A        .WORD      0/4         ;0 14 14 14 14 14    00010320
325 0141 1644 A        .WORD  22800/4         ; 1                  00010321
326 0142 1676 A        .WORD  23000/4         ;  2                 00010322
327 0143 165D A        .WORD  22900/4         ;   3                00010323
328 0144 16A8 A        .WORD  23200/4         ;    4               00010324
329 0145 0000 A        .WORD      0/4         ;     5              00010325
330 0146 168F A        .WORD  23100/4         ;      6             00010326
331 0147 0000 A        .WORD      0/4         ;       7            00010327
332 0148 0000 A        .WORD      0/4         ;        8           00010328
333 0149 1725 A        .WORD  23700/4         ;         9          00010329
334 014A 16F3 A        .WORD  23500/4         ;          A         00010330
335 014B 170C A        .WORD  23600/4         ;           B        00010331
336 014C 16C1 A        .WORD  23300/4         ;            C       00010332
```

```
337 014D 0000 A        .WORD       0/4         ;           D          00010333
338 014E 160A A        .WORD   23400/4         ;            E         00010334
339 014F 0000 A        .WORD       0/4         ;             F        00010335
340 0150 0000 A        .WORD       0/4         ;0 15 15 15 15 15      00010336
341 0151 181F A        .WORD   24700/4         ; 1                    00010337
342 0152 17ED A        .WORD   24500/4         ;  2                   00010338
343 0153 1806 A        .WORD   24600/4         ;   3                  00010339
344 0154 17BB A        .WORD   24300/4         ;    4                 00010340
345 0155 0000 A        .WORD       0/4         ;     5                00010341
346 0156 17D4 A        .WORD   24400/4         ;      6               00010342
347 0157 0000 A        .WORD       0/4         ;       7              00010343
348 0158 0000 A        .WORD       0/4         ;        8             00010344
349 0159 173E A        .WORD   23800/4         ;         9            00010345
350 015A 1770 A        .WORD   24000/4         ;          A           00010346
351 015B 1757 A        .WORD   23900/4         ;           B          00010347
352 015C 17A2 A        .WORD   24200/4         ;            C         00010348
353 015D 0000 A        .WORD       0/4         ;             D        00010349
354 015E 1789 A        .WORD   24100/4         ;              E       00010350
355 015F 0000 A        .WORD       0/4         ;               F      00010351
356 0160 0000 A        .WORD       0/4         ;0 16 16 16 16 16      00010352
357 0161 1A13 A        .WORD   26700/4         ; 1                    00010353
358 0162 19E1 A        .WORD   26500/4         ;  2                   00010354
359 0163 19FA A        .WORD   26600/4         ;   3                  00010355
360 0164 19AF A        .WORD   26300/4         ;    4                 00010356
361 0165 0000 A        .WORD       0/4         ;     5                00010357
362 0166 19C8 A        .WORD   26400/4         ;      6               00010358
363 0167 0000 A        .WORD       0/4         ;       7              00010359
364 0168 0000 A        .WORD       0/4         ;        8             00010360
365 0169 1932 A        .WORD   25800/4         ;         9            00010361
366 016A 1964 A        .WORD   26000/4         ;          A           00010362
367 016B 194B A        .WORD   25900/4         ;           B          00010363
368 016C 1996 A        .WORD   26200/4         ;            C         00010364
369 016D 0000 A        .WORD       0/4         ;             D        00010365
370 016E 197D A        .WORD   26100/4         ;              E       00010366
371 016F 0000 A        .WORD       0/4         ;               F      00010367
372 0170 0000 A        .WORD       0/4         ;0 17 17 17 17 17      00010368
373 0171 1838 A        .WORD   24800/4         ; 1                    00010369
374 0172 186A A        .WORD   25000/4         ;  2                   00010370
375 0173 1851 A        .WORD   24900/4         ;   3                  00010371
376 0174 189C A        .WORD   25200/4         ;    4                 00010372
377 0175 0000 A        .WORD       0/4         ;     5                00010373
378 0176 1883 A        .WORD   25100/4         ;      6               00010374
379 0177 0000 A        .WORD       0/4         ;       7              00010375
380 0178 0000 A        .WORD       0/4         ;        8             00010376
381 0179 1919 A        .WORD   25700/4         ;         9            00010377
382 017A 18E7 A        .WORD   25500/4         ;          A           00010378
383 017B 1900 A        .WORD   25600/4         ;           B          00010379
384 017C 18B5 A        .WORD   25300/4         ;            C         00010380
385 017D 0000 A        .WORD       0/4         ;             D        00010381
386 017E 18CE A        .WORD   25400/4         ;              E       00010382
387 017F 0000 A        .WORD       0/4         ;               F      00010383
388 0180 0000 A        .WORD       0/4         ;0 18 18 18 18 18      00010384
389 0181 0E74 A        .WORD   14800/4         ; 1                    00010385
390 0182 0EA6 A        .WORD   15000/4         ;  2                   00010386
391 0183 0E8D A        .WORD   14900/4         ;   3                  00010387
392 0184 0ED8 A        .WORD   15200/4         ;    4                 00010388
393 0185 0000 A        .WORD       0/4         ;     5                00010389
394 0186 0EBF A        .WORD   15100/4         ;      6               00010390
395 0187 0000 A        .WORD       0/4         ;       7              00010391
396 0188 0000 A        .WORD       0/4         ;        8             00010392
397 0189 0F55 A        .WORD   15700/4         ;         9            00010393
398 018A 0F23 A        .WORD   15500/4         ;          A           00010394
399 018B 0F3C A        .WORD   15600/4         ;           B          00010395
400 018C 0EF1 A        .WORD   15300/4         ;            C         00010396
401 018D 0000 A        .WORD       0/4         ;             D        00010397
402 018E 0F0A A        .WORD   15400/4         ;              E       00010398
403 018F 0000 A        .WORD       0/4         ;               F      00010399
404 0190 0000 A        .WORD       0/4         ;0 19 19 19 19 19      00010400
405 0191 104F A        .WORD   16700/4         ; 1                    00010401
406 0192 101D A        .WORD   16500/4         ;  2                   00010402
407 0193 1036 A        .WORD   16600/4         ;   3                  00010403
408 0194 0FEB A        .WORD   16300/4         ;    4                 00010404
409 0195 0000 A        .WORD       0/4         ;     5                00010405
410 0196 1004 A        .WORD   16400/4         ;      6               00010406
411 0197 0000 A        .WORD       0/4         ;       7              00010407
412 0198 0000 A        .WORD       0/4         ;        8             00010408
413 0199 0F6E A        .WORD   15800/4         ;         9            00010409
414 019A 0FA0 A        .WORD   16000/4         ;          A           00010410
415 019B 0F87 A        .WORD   15900/4         ;           B          00010411
```

```
416 019C 0FD2 A      .WORD    16200/4    ;              C              00010412
417 019D 0000 A      .WORD        0/4    ;               D             00010413
418 019E 0FB9 A      .WORD    16100/4    ;                E            00010414
419 019F 0000 A      .WORD        0/4    ;                 F           00010415
420 01A0 0000 A      .WORD        0/4    ;0 1A 1A 1A 1A 1A             00010416
421 01A1 1243 A      .WORD    18700/4    ; 1                           00010417
422 01A2 1211 A      .WORD    18500/4    ;  2                          00010418
423 01A3 122A A      .WORD    18600/4    ;   3                         00010419
424 01A4 11DF A      .WORD    18300/4    ;    4                        00010420
425 01A5 0000 A      .WORD        0/4    ;     5                       00010421
426 01A6 11F8 A      .WORD    18400/4    ;      6                      00010422
427 01A7 0000 A      .WORD        0/4    ;       7                     00010423
428 01A8 0000 A      .WORD        0/4    ;        8                    00010424
429 01A9 1162 A      .WORD    17800/4    ;         9                   00010425
430 01AA 1194 A      .WORD    18000/4    ;          A                  00010426
431 01AB 117B A      .WORD    17900/4    ;           B                 00010427
432 01AC 11C6 A      .WORD    18200/4    ;            C                00010428
433 01AD 0000 A      .WORD        0/4    ;             D               00010429
434 01AE 11AD A      .WORD    18100/4    ;              E              00010430
435 01AF 0000 A      .WORD        0/4    ;               F             00010431
436 01B0 0000 A      .WORD        0/4    ;0 1B 1B 1B 1B 1B             00010432
437 01B1 1068 A      .WORD    16800/4    ; 1                           00010433
438 01B2 109A A      .WORD    17000/4    ;  2                          00010434
439 01B3 1081 A      .WORD    16900/4    ;   3                         00010435
440 01B4 10CC A      .WORD    17200/4    ;    4                        00010436
441 01B5 0000 A      .WORD        0/4    ;     5                       00010437
442 01B6 10B3 A      .WORD    17100/4    ;      6                      00010438
443 01B7 0000 A      .WORD        0/4    ;       7                     00010439
444 01B8 0000 A      .WORD        0/4    ;        8                    00010440
445 01B9 1149 A      .WORD    17700/4    ;         9                   00010441
446 01BA 1117 A      .WORD    17500/4    ;          A                  00010442
447 01BB 1130 A      .WORD    17600/4    ;           B                 00010443
448 01BC 10E5 A      .WORD    17300/4    ;            C                00010444
449 01BD 0000 A      .WORD        0/4    ;             D               00010445
450 01BE 10FE A      .WORD    17400/4    ;              E              00010446
451 01BF 0000 A      .WORD        0/4    ;               F             00010447
452 01C0 0000 A      .WORD        0/4    ;0 1C 1C 1C 1C 1C             00010448
453 01C1 162B A      .WORD    22700/4    ; 1                           00010449
454 01C2 15F9 A      .WORD    22500/4    ;  2                          00010450
455 01C3 1612 A      .WORD    22600/4    ;   3                         00010451
456 01C4 15C7 A      .WORD    22300/4    ;    4                        00010452
457 01C5 0000 A      .WORD        0/4    ;     5                       00010453
458 01C6 15E0 A      .WORD    22400/4    ;      6                      00010454
459 01C7 0000 A      .WORD        0/4    ;       7                     00010455
460 01C8 0000 A      .WORD        0/4    ;        8                    00010456
461 01C9 154A A      .WORD    21800/4    ;         9                   00010457
462 01CA 157C A      .WORD    22000/4    ;          A                  00010458
463 01CB 1563 A      .WORD    21900/4    ;           B                 00010459
464 01CC 15AE A      .WORD    22200/4    ;            C                00010460
465 01CD 0000 A      .WORD        0/4    ;             D               00010461
466 01CE 1595 A      .WORD    22100/4    ;              E              00010462
467 01CF 0000 A      .WORD        0/4    ;               F             00010463
468 01D0 0000 A      .WORD        0/4    ;0 1D 1D 1D 1D 1D             00010464
469 01D1 1450 A      .WORD    20800/4    ; 1                           00010465
470 01D2 1482 A      .WORD    21000/4    ;  2                          00010466
471 01D3 1469 A      .WORD    20900/4    ;   3                         00010467
472 01D4 14B4 A      .WORD    21200/4    ;    4                        00010468
473 01D5 0000 A      .WORD        0/4    ;     5                       00010469
474 01D6 149B A      .WORD    21100/4    ;      6                      00010470
475 01D7 0000 A      .WORD        0/4    ;       7                     00010471
476 01D8 0000 A      .WORD        0/4    ;        8                    00010472
477 01D9 1531 A      .WORD    21700/4    ;         9                   00010473
478 01DA 14FF A      .WORD    21500/4    ;          A                  00010474
479 01DB 1518 A      .WORD    21600/4    ;           B                 00010475
480 01DC 14CD A      .WORD    21300/4    ;            C                00010476
481 01DD 0000 A      .WORD        0/4    ;             D               00010477
482 01DE 14E6 A      .WORD    21400/4    ;              E              00010478
483 01DF 0000 A      .WORD        0/4    ;               F             00010479
484 01E0 0000 A      .WORD        0/4    ;0 1E 1E 1E 1E 1E             00010480
485 01E1 125C A      .WORD    18800/4    ; 1                           00010481
486 01E2 128E A      .WORD    19000/4    ;  2                          00010482
487 01E3 1275 A      .WORD    18900/4    ;   3                         00010483
488 01E4 12C0 A      .WORD    19200/4    ;    4                        00010484
489 01E5 0000 A      .WORD        0/4    ;     5                       00010485
490 01E6 12A7 A      .WORD    19100/4    ;      6                      00010486
491 01E7 0000 A      .WORD        0/4    ;       7                     00010487
492 01E8 0000 A      .WORD        0/4    ;        8                    00010488
493 01E9 133D A      .WORD    19700/4    ;         9                   00010489
```

```
494 01EA 130B A         .WORD    19500/4   ;            A              00010490
495 01EB 1324 A         .WORD    19600/4   ;             B             00010491
496 01EC 12D9 A         .WORD    19300/4   ;              C            00010492
497 01ED 0000 A         .WORD        0/4   ;               D           00010493
498 01EE 12F2 A         .WORD    19400/4   ;                E          00010494
499 01EF 0000 A         .WORD        0/4   ;                 F         00010495
500 01F0 0000 A         .WORD        0/4   ;0 1F 1F 1F 1F 1F            00010496
501 01F1 1437 A         .WORD    20700/4   ; 1'                        00010497
502 01F2 1405 A         .WORD    20500/4   ; 2                         00010498
503 01F3 141E A         .WORD    20600/4   ;  3                        00010499
504 01F4 13D3 A         .WORD    20300/4   ;   4                       00010500
505 01F5 0000 A         .WORD        0/4   ;    5                      00010501
506 01F6 13EC A         .WORD    20400/4   ;     6                     00010502
507 01F7 0000 A         .WORD        0/4   ;      7                    00010503
508 01F8 0000 A         .WORD        0/4   ;       8                   00010504
509 01F9 1356 A         .WORD    19800/4   ;        9                  00010505
510 01FA 1388 A         .WORD    20000/4   ;         A                 00010506
511 01FB 136F A         .WORD    19900/4   ;          B                00010507
512 01FC 13BA A         .WORD    20200/4   ;           C               00010508
513 01FD 0000 A         .WORD        0/4   ;            D              00010509
514 01FE 13A1 A         .WORD    20100/4   ;             E             00010510
515 01FF 0000 A         .WORD        0/4   ;              F            00010511
516 0200 0000 A         .WORD        0/4   ;0 20 20 20 20 20           00010512
517 0201 3D3B A         .WORD    62700/4   ; 1                         00010513
518 0202 3D09 A         .WORD    62500/4   ; 2                         00010514
519 0203 3D22 A         .WORD    62600/4   ;  3                        00010515
520 0204 3CD7 A         .WORD    62300/4   ;   4                       00010516
521 0205 0000 A         .WORD        0/4   ;    5                      00010517
522 0206 3CF0 A         .WORD    62400/4   ;     6                     00010518
523 0207 0000 A         .WORD        0/4   ;      7                    00010519
524 0208 0000 A         .WORD        0/4   ;       8                   00010520
525 0209 3C5A A         .WORD    61800/4   ;        9                  00010521
526 020A 3C8C A         .WORD    62000/4   ;         A                 00010522
527 020B 3C73 A         .WORD    61900/4   ;          B                00010523
528 020C 3CBE A         .WORD    62200/4   ;           C               00010524
529 020D 0000 A         .WORD        0/4   ;            D              00010525
530 020E 3CA5 A         .WORD    62100/4   ;             E             00010526
531 020F 0000 A         .WORD        0/4   ;              F            00010527
532 0210 0000 A         .WORD        0/4   ;0 21 21 21 21 21           00010528
533 0211 3B60 A         .WORD    60800/4   ; 1                         00010529
534 0212 3D92 A         .WORD    61000/4   ; 2                         00010530
535 0213 3B79 A         .WORD    60900/4   ;  3                        00010531
536 0214 3BC4 A         .WORD    61200/4   ;   4                       00010532
537 0215 0000 A         .WORD        0/4   ;    5                      00010533
538 0216 3BAB A         .WORD    61100/4   ;     6                     00010534
539 0217 0000 A         .WORD        0/4   ;      7                    00010535
540 0218 0000 A         .WORD        0/4   ;       8                   00010536
541 0219 3C41 A         .WORD    61700/4   ;        9                  00010537
542 021A 3C0F A         .WORD    61500/4   ;         A                 00010538
543 021B 3C28 A         .WORD    61600/4   ;          B                00010539
544 021C 3BDD A         .WORD    61300/4   ;           C               00010540
545 021D 0000 A         .WORD        0/4   ;            D              00010541
546 021E 3BF6 A         .WORD    61400/4   ;             E             00010542
547 021F 0000 A         .WORD        0/4   ;              F            00010543
548 0220 0000 A         .WORD        0/4   ;0 22 22 22 22 22           00010544
549 0221 396C A         .WORD    58800/4   ; 1                         00010545
550 0222 399E A         .WORD    59000/4   ; 2                         00010546
551 0223 3985 A         .WORD    58900/4   ;  3                        00010547
552 0224 39D0 A         .WORD    59200/4   ;   4                       00010548
553 0225 0000 A         .WORD        0/4   ;    5                      00010549
554 0226 39B7 A         .WORD    59100/4   ;     6                     00010550
555 0227 0000 A         .WORD        0/4   ;      7                    00010551
556 0228 0000 A         .WORD        0/4   ;       8                   00010552
557 0229 3A4D A         .WORD    59700/4   ;        9                  00010553
558 022A 3A1B A         .WORD    59500/4   ;         A                 00010554
559 022B 3A34 A         .WORD    59600/4   ;          B                00010555
560 022C 39E9 A         .WORD    59300/4   ;           C               00010556
561 022D 0000 A         .WORD        0/4   ;            D              00010557
562 022E 3A02 A         .WORD    59400/4   ;             E             00010558
563 022F 0000 A         .WORD        0/4   ;              F            00010559
564 0230 0000 A         .WORD        0/4   ;0 23 23 23 23 23           00010560
565 0231 3B47 A         .WORD    60700/4   ; 1                         00010561
566 0232 3B15 A         .WORD    60500/4   ; 2                         00010562
567 0233 3B2E A         .WORD    60600/4   ;  3                        00010563
568 0234 3AE3 A         .WORD    60300/4   ;   4                       00010564
569 0235 0000 A         .WORD        0/4   ;    5                      00010565
570 0236 3AFC A         .WORD    60400/4   ;     6                     00010566
571 0237 0000 A         .WORD        0/4   ;      7                    00010567
```

```
572 0238 0000 A        .WORD      0/4        ;          8              00010568
573 0239 3A66 A        .WORD      59800/4    ;           9             00010569
574 023A 3A98 A        .WORD      60000/4    ;            A            00010570
575 023B 3A7F A        .WORD      59900/4    ;             B           00010571
576 023C 3ACA A        .WORD      60200/4    ;              C          00010572
577 023D 0000 A        .WORD      0/4        ;               D         00010573
578 023E 3AB1 A        .WORD      60100/4    ;                E        00010574
579 023F 0000 A        .WORD      0/4        ;                 F       00010575
580 0240 0000 A        .WORD      0/4        ;0 24 24 24 24 24         00010576
581 0241 3584 A        .WORD      54800/4    ; 1                       00010577
582 0242 35B6 A        .WORD      55000/4    ;  2                      00010578
583 0243 359D A        .WORD      54900/4    ;   3                     00010579
584 0244 35E8 A        .WORD      55200/4    ;    4                    00010580
585 0245 0000 A        .WORD      0/4        ;     5                   00010581
586 0246 35CF A        .WORD      55100/4    ;      6                  00010582
587 0247 0000 A        .WORD      0/4        ;       7                 00010583
588 0248 0000 A        .WORD      0/4        ;        8                00010584
589 0249 3665 A        .WORD      55700/4    ;         9               00010585
590 024A 3633 A        .WORD      55500/4    ;          A              00010586
591 024B 364C A        .WORD      55600/4    ;           B             00010587
592 024C 3601 A        .WORD      55300/4    ;            C            00010588
593 024D 0000 A        .WORD      0/4        ;             D           00010589
594 024E 361A A        .WORD      55400/4    ;              E          00010590
595 024F 0000 A        .WORD      0/4        ;               F         00010591
596 0250 0000 A        .WORD      0/4        ;0 25 25 25 25 25         00010592
597 0251 375F A        .WORD      56700/4    ; 1                       00010593
598 0252 372D A        .WORD      56500/4    ;  2                      00010594
599 0253 3746 A        .WORD      56600/4    ;   3                     00010595
600 0254 36FB A        .WORD      56300/4    ;    4                    00010596
601 0255 0000 A        .WORD      0/4        ;     5                   00010597
602 0256 3714 A        .WORD      56400/4    ;      6                  00010598
603 0257 0000 A        .WORD      0/4        ;       7                 00010599
604 0258 0000 A        .WORD      0/4        ;        8                00010600
605 0259 367E A        .WORD      55800/4    ;         9               00010601
606 025A 36B0 A        .WORD      56000/4    ;          A              00010602
607 025B 3697 A        .WORD      55900/4    ;           B             00010603
608 025C 36E2 A        .WORD      56200/4    ;            C            00010604
609 025D 0000 A        .WORD      0/4        ;             D           00010605
610 025E 36C9 A        .WORD      56100/4    ;              E          00010606
611 025F 0000 A        .WORD      0/4        ;               F         00010607
612 0260 0000 A        .WORD      0/4        ;0 26 26 26 26 26         00010608
613 0261 3953 A        .WORD      58700/4    ; 1                       00010609
614 0262 3921 A        .WORD      58500/4    ;  2                      00010610
615 0263 393A A        .WORD      58600/4    ;   3                     00010611
616 0264 38EF A        .WORD      58300/4    ;    4                    00010612
617 0265 0000 A        .WORD      0/4        ;     5                   00010613
618 0266 3908 A        .WORD      58400/4    ;      6                  00010614
619 0267 0000 A        .WORD      0/4        ;       7                 00010615
620 0268 0000 A        .WORD      0/4        ;        8                00010616
621 0269 3872 A        .WORD      57800/4    ;         9               00010617
622 026A 38A4 A        .WORD      58000/4    ;          A              00010618
623 026B 388B A        .WORD      57900/4    ;           B             00010619
624 026C 38D6 A        .WORD      58200/4    ;            C            00010620
625 026D 0000 A        .WORD      0/4        ;             D           00010621
626 026E 38BD A        .WORD      58100/4    ;              E          00010622
627 026F 0000 A        .WORD      0/4        ;               F         00010623
628 0270 0000 A        .WORD      0/4        ;0 27 27 27 27 27         00010624
629 0271 3778 A        .WORD      56800/4    ; 1                       00010625
630 0272 37AA A        .WORD      57000/4    ;  2                      00010626
631 0273 3791 A        .WORD      56900/4    ;   3                     00010627
632 0274 37DC A        .WORD      57200/4    ;    4                    00010628
633 0275 0000 A        .WORD      0/4        ;     5                   00010629
634 0276 37C3 A        .WORD      57100/4    ;      6                  00010630
635 0277 0000 A        .WORD      0/4        ;       7                 00010631
636 0278 0000 A        .WORD      0/4        ;        8                00010632
637 0279 3859 A        .WORD      57700/4    ;         9               00010633
638 027A 3827 A        .WORD      57500/4    ;          A              00010634
639 027B 3840 A        .WORD      57600/4    ;           B             00010635
640 027C 37F5 A        .WORD      57300/4    ;            C            00010636
641 027D 0000 A        .WORD      0/4        ;             D           00010637
642 027E 380E A        .WORD      57400/4    ;              E          00010638
643 027F 0000 A        .WORD      0/4        ;               F         00010639
644 0280 0000 A        .WORD      0/4        ;0 28 28 28 28 28         00010640
645 0281 2DB4 A        .WORD      46800/4    ; 1                       00010641
646 0282 2DE6 A        .WORD      47000/4    ;  2                      00010642
647 0283 2DCD A        .WORD      46900/4    ;   3                     00010643
648 0284 2E18 A        .WORD      47200/4    ;    4                    00010644
649 0285 0000 A        .WORD      0/4        ;     5                   00010645
```

```
650 0286 2DFF A        .WORD    47100/4     ;          6                          00010646
651 0287 0000 A        .WORD      0/4       ;           7                         00010647
652 0288 0000 A        .WORD      0/4       ;            8                        00010648
653 0289 2E95 A        .WORD    47700/4     ;             9                       00010649
654 028A 2E63 A        .WORD    47500/4     ;              A                      00010650
655 028B 2E7C A        .WORD    47600/4     ;               B                     00010651
656 028C 2E31 A        .WORD    47300/4     ;                C                    00010652
657 028D 0000 A        .WORD      0/4       ;                 D                   00010653
658 028E 2E4A A        .WORD    47400/4     ;                  E                  00010654
659 028F 0000 A        .WORD      0/4       ;                   F                 00010655
660 0290 0000 A        .WORD      0/4       ;0 29 29 29 29 29                     00010656
661 0291 2F8F A        .WORD    48700/4     ; 1                                   00010657
662 0292 2F5D A        .WORD    48500/4     ;  2                                  00010658
663 0293 2F76 A        .WORD    48600/4     ;   3                                 00010659
664 0294 2F2B A        .WORD    48300/4     ;    4                                00010660
665 0295 0000 A        .WORD      0/4       ;     5                               00010661
666 0296 2F44 A        .WORD    48400/4     ;      6                              00010662
667 0297 0000 A        .WORD      0/4       ;       7                             00010663
668 0298 0000 A        .WORD      0/4       ;        8                            00010664
669 0299 2EAE A        .WORD    47800/4     ;         9                           00010665
670 029A 2EE0 A        .WORD    48000/4     ;          A                          00010666
671 029B 2EC7 A        .WORD    47900/4     ;           B                         00010667
672 029C 2F12 A        .WORD    48200/4     ;            C                        00010668
673 029D 0000 A        .WORD      0/4       ;             D                       00010669
674 029E 2EF9 A        .WORD    48100/4     ;              E                      00010670
675 029F 0000 A        .WORD      0/4       ;               F                     00010671
676 02A0 0000 A        .WORD      0/4       ;0 2A 2A 2A 2A 2A                     00010672
677 02A1 3183 A        .WORD    50700/4     ; 1                                   00010673
678 02A2 3151 A        .WORD    50500/4     ;  2                                  00010674
679 02A3 316A A        .WORD    50600/4     ;   3                                 00010675
680 02A4 311F A        .WORD    50300/4     ;    4                                00010676
681 02A5 0000 A        .WORD      0/4       ;     5                               00010677
682 02A6 3138 A        .WORD    50400/4     ;      6                              00010678
683 02A7 0000 A        .WORD      0/4       ;       7                             00010679
684 02A8 0000 A        .WORD      0/4       ;        8                            00010680
685 02A9 30A2 A        .WORD    49800/4     ;         9                           00010681
686 02AA 30D4 A        .WORD    50000/4     ;          A                          00010682
687 02AB 30BB A        .WORD    49900/4     ;           B                         00010683
688 02AC 3106 A        .WORD    50200/4     ;            C                        00010684
689 02AD 0000 A        .WORD      0/4       ;             D                       00010685
690 02AE 30ED A        .WORD    50100/4     ;              E                      00010686
691 02AF 0000 A        .WORD      0/4       ;               F                     00010687
692 02B0 0000 A        .WORD      0/4       ;0 2B 2B 2B 2B 2B                     00010688
693 02B1 2FA8 A        .WORD    48800/4     ; 1                                   00010689
694 02B2 2FDA A        .WORD    49000/4     ;  2                                  00010690
695 02B3 2FC1 A        .WORD    48900/4     ;   3                                 00010691
696 02B4 300C A        .WORD    49200/4     ;    4                                00010692
697 02B5 0000 A        .WORD      0/4       ;     5                               00010693
698 02B6 2FF3 A        .WORD    49100/4     ;      6                              00010694
699 02B7 0000 A        .WORD      0/4       ;       7                             00010695
700 02B8 0000 A        .WORD      0/4       ;        8                            00010696
701 02B9 3089 A        .WORD    49700/4     ;         9                           00010697
702 02BA 3057 A        .WORD    49500/4     ;          A                          00010698
703 02BB 3070 A        .WORD    49600/4     ;           B                         00010699
704 02BC 3025 A        .WORD    49300/4     ;            C                        00010700
705 02BD 0000 A        .WORD      0/4       ;             D                       00010701
706 02BE 303E A        .WORD    49400/4     ;              E                      00010702
707 02BF 0000 A        .WORD      0/4       ;               F                     00010703
708 02C0 0000 A        .WORD      0/4       ;0 2C 2C 2C 2C 2C                     00010704
709 02C1 356B A        .WORD    54700/4     ; 1                                   00010705
710 02C2 3539 A        .WORD    54500/4     ;  2                                  00010706
711 02C3 3552 A        .WORD    54600/4     ;   3                                 00010707
712 02C4 3507 A        .WORD    54300/4     ;    4                                00010708
713 02C5 0000 A        .WORD      0/4       ;     5                               00010709
714 02C6 3520 A        .WORD    54400/4     ;      6                              00010710
715 02C7 0000 A        .WORD      0/4       ;       7                             00010711
716 02C8 0000 A        .WORD      0/4       ;        8                            00010712
717 02C9 348A A        .WORD    53800/4     ;         9                           00010713
718 02CA 34BC A        .WORD    54000/4     ;          A                          00010714
719 02CB 34A3 A        .WORD    53900/4     ;           B                         00010715
720 02CC 34EE A        .WORD    54200/4     ;            C                        00010716
721 02CD 0000 A        .WORD      0/4       ;             D                       00010717
722 02CE 34D5 A        .WORD    54100/4     ;              E                      00010718
723 02CF 0000 A        .WORD      0/4       ;               F                     00010719
724 02D0 0000 A        .WORD      0/4       ;0 2D 2D 2D 2D 2D                     00010720
725 02D1 3390 A        .WORD    52800/4     ; 1                                   00010721
726 02D2 33C2 A        .WORD    53000/4     ;  2                                  00010722
727 02D3 33A9 A        .WORD    52900/4     ;   3                                 00010723
```

```
728 02D4 33F4 A      .WORD    53200/4      ;          4                                  00010724
729 02D5 0000 A      .WORD        0/4      ;           5                                 00010725
730 02D6 330B A      .WORD    53100/4      ;            6                                00010726
731 02D7 0000 A      .WORD        0/4      ;             7                               00010727
732 02D8 0000 A      .WORD        0/4      ;              8                              00010728
733 02D9 3471 A      .WORD    53700/4      ;               9                             00010729
734 02DA 343F A      .WORD    53500/4      ;                A                            00010730
735 02DB 3458 A      .WORD    53600/4      ;                 B                           00010731
736 02DC 340D A      .WORD    53300/4      ;                  C                          00010732
737 02DD 0000 A      .WORD        0/4      ;                   D                         00010733
738 02DE 3426 A      .WORD    53400/4      ;                    E                        00010734
739 02DF 0000 A      .WORD        0/4      ;                     F                       00010735
740 02E0 0000 A      .WORD        0/4      ;0 2E 2E 2E 2E 2E                             00010736
741 02E1 319C A      .WORD    50800/4      ; 1                                           00010737
742 02E2 31CE A      .WORD    51000/4      ;  2                                          00010738
743 02E3 31B5 A      .WORD    50900/4      ;   3                                         00010739
744 02E4 3200 A      .WORD    51200/4      ;    4                                        00010740
745 02E5 0000 A      .WORD        0/4      ;     5                                       00010741
746 02E6 31E7 A      .WORD    51100/4      ;      6                                      00010742
747 02E7 0000 A      .WORD        0/4      ;       7                                     00010743
748 02E8 0000 A      .WORD        0/4      ;        8                                    00010744
749 02E9 327D A      .WORD    51700/4      ;         9                                   00010745
750 02EA 324B A      .WORD    51500/4      ;          A                                  00010746
751 02EB 3264 A      .WORD    51600/4      ;           B                                 00010747
752 02EC 3219 A      .WORD    51300/4      ;            C                                00010748
753 02ED 0000 A      .WORD        0/4      ;             D                               00010749
754 02EE 3232 A      .WORD    51400/4      ;              E                              00010750
755 02EF 0000 A      .WORD        0/4      ;               F                             00010751
756 02F0 0000 A      .WORD        0/4      ;0 2F 2F 2F 2F 2F                             00010752
757 02F1 3377 A      .WORD    52700/4      ; 1                                           00010753
758 02F2 3345 A      .WORD    52500/4      ;  2                                          00010754
759 02F3 335E A      .WORD    52600/4      ;   3                                         00010755
760 02F4 3313 A      .WORD    52300/4      ;    4                                        00010756
761 02F5 0000 A      .WORD        0/4      ;     5                                       00010757
762 02F6 332C A      .WORD    52400/4      ;      6                                      00010758
763 02F7 0000 A      .WORD        0/4      ;       7                                     00010759
764 02F8 0000 A      .WORD        0/4      ;        8                                    00010760
765 02F9 3296 A      .WORD    51800/4      ;         9                                   00010761
766 02FA 32C8 A      .WORD    52000/4      ;          A                                  00010762
767 02FB 32AF A      .WORD    51900/4      ;           B                                 00010763
768 02FC 32FA A      .WORD    52200/4      ;            C                                00010764
769 02FD 0000 A      .WORD        0/4      ;             D                               00010765
770 02FE 32E1 A      .WORD    52100/4      ;              E                              00010766
771 02FF 0000 A      .WORD        0/4      ;               F                             00010767
772 0300 0000 A      .WORD        0/4      ;0 30 30 30 30 30                             00010768
773 0301 1E14 A      .WORD    30800/4      ; 1                                           00010769
774 0302 1E46 A      .WORD    31000/4      ;  2                                          00010770
775 0303 1E2D A      .WORD    30900/4      ;   3                                         00010771
776 0304 1E78 A      .WORD    31200/4      ;    4                                        00010772
777 0305 0000 A      .WORD        0/4      ;     5                                       00010773
778 0306 1E5F A      .WORD    31100/4      ;      6                                      00010774
779 0307 0000 A      .WORD        0/4      ;       7                                     00010775
780 0308 0000 A      .WORD        0/4      ;        8                                    00010776
781 0309 1EF5 A      .WORD    31700/4      ;         9                                   00010777
782 030A 1EC3 A      .WORD    31500/4      ;          A                                  00010778
783 030B 1EDC A      .WORD    31600/4      ;           B                                 00010779
784 030C 1E91 A      .WORD    31300/4      ;            C                                00010780
785 030D 0000 A      .WORD        0/4      ;             D                               00010781
786 030E 1EAA A      .WORD    31400/4      ;              E                              00010782
787 030F 0000 A      .WORD        0/4      ;               F                             00010783
788 0310 0000 A      .WORD        0/4      ;0 31 31 31 31 31                             00010784
789 0311 1FEF A      .WORD    32700/4      ; 1                                           00010785
790 0312 1FBD A      .WORD    32500/4      ;  2                                          00010786
791 0313 1FD6 A      .WORD    32600/4      ;   3                                         00010787
792 0314 1F8B A      .WORD    32300/4      ;    4                                        00010788
793 0315 0000 A      .WORD        0/4      ;     5                                       00010789
794 0316 1FA4 A      .WORD    32400/4      ;      6                                      00010790
795 0317 0000 A      .WORD        0/4      ;       7                                     00010791
796 0318 0000 A      .WORD        0/4      ;        8                                    00010792
797 0319 1F0E A      .WORD    31800/4      ;         9                                   00010793
798 031A 1F40 A      .WORD    32000/4      ;          A                                  00010794
799 031B 1F27 A      .WORD    31900/4      ;           B                                 00010795
800 031C 1F72 A      .WORD    32200/4      ;            C                                00010796
801 031D 0000 A      .WORD        0/4      ;             D                               00010797
802 031E 1F59 A      .WORD    32100/4      ;              E                              00010798
803 031F 0000 A      .WORD        0/4      ;               F                             00010799
804 0320 0000 A      .WORD        0/4      ;0 32 32 32 32 32                             00010800
805 0321 21E3 A      .WORD    34700/4      ; 1                                           00010801
```

```
806 0322 2181 A        .WORD      34500/4       ;      2                          00010802
807 0323 21CA A        .WORD      34600/4       ;       3                         00010803
808 0324 217F A        .WORD      34300/4       ;        4                        00010804
809 0325 0000 A        .WORD          0/4       ;         5                       00010805
810 0326 2198 A        .WORD      34400/4       ;          6                      00010806
811 0327 0000 A        .WORD          0/4       ;           7                     00010807
812 0328 0000 A        .WORD          0/4       ;            8                    00010808
813 0329 2102 A        .WORD      33800/4       ;             9                   00010809
814 032A 2134 A        .WORD      34000/4       ;              A                  00010810
815 032B 211B A        .WORD      33900/4       ;               B                 00010811
816 032C 2166 A        .WORD      34200/4       ;                C                00010812
817 032D 0000 A        .WORD          0/4       ;                 D               00010813
818 032E 214D A        .WORD      34100/4       ;                  E              00010814
819 032F 0000 A        .WORD          0/4       ;                   F             00010815
820 0330 0000 A        .WORD          0/4       ;0  33 33 33 33 33                00010816
821 0331 2008 A        .WORD      32800/4       ; 1                               00010817
822 0332 203A A        .WORD      33000/4       ;  2                              00010818
823 0333 2021 A        .WORD      32900/4       ;   3                             00010819
824 0334 206C A        .WORD      33200/4       ;    4                            00010820
825 0335 0000 A        .WORD          0/4       ;     5                           00010821
826 0336 2053 A        .WORD      33100/4       ;      6                          00010822
827 0337 0000 A        .WORD          0/4       ;       7                         00010823
828 0338 0000 A        .WORD          0/4       ;        8                        00010824
829 0339 20E9 A        .WORD      33700/4       ;         9                       00010825
830 033A 20B7 A        .WORD      33500/4       ;          A                      00010826
831 033B 20D0 A        .WORD      33600/4       ;           B                     00010827
832 033C 2085 A        .WORD      33300/4       ;            C                    00010828
833 033D 0000 A        .WORD          0/4       ;             D                   00010829
834 033E 209E A        .WORD      33400/4       ;              E                  00010830
835 033F 0000 A        .WORD          0/4       ;               F                 00010831
836 0340 0000 A        .WORD          0/4       ;0  34 34 34 34 34                00010832
837 0341 25CB A        .WORD      38700/4       ; 1                               00010833
838 0342 2599 A        .WORD      38500/4       ;  2                              00010834
839 0343 25B2 A        .WORD      38600/4       ;   3                             00010835
840 0344 2567 A        .WORD      38300/4       ;    4                            00010836
841 0345 0000 A        .WORD          0/4       ;     5                           00010837
842 0346 2580 A        .WORD      38400/4       ;      6                          00010838
843 0347 0000 A        .WORD          0/4       ;       7                         00010839
844 0348 0000 A        .WORD          0/4       ;        8                        00010840
845 0349 24EA A        .WORD      37800/4       ;         9                       00010841
846 034A 251C A        .WCRD      38000/4       ;          A                      00010842
847 034B 2503 A        .WORD      37900/4       ;           B                     00010843
848 034C 254E A        .WORD      38200/4       ;            C                    00010844
849 034D 0000 A        .WORD          0/4       ;             D                   00010845
850 034E 2535 A        .WORD      38100/4       ;              E                  00010846
851 034F 0000 A        .WORD          0/4       ;               F                 00010847
852 0350 0000 A        .WORD          0/4       ;0  35 35 35 35 35                00010848
853 0351 23F0 A        .WORD      36800/4       ; 1                               00010849
854 0352 2422 A        .WORD      37000/4       ;  2                              00010850
855 0353 2409 A        .WORD      36900/4       ;   3                             00010851
856 0354 2454 A        .WORD      37200/4       ;    4                            00010852
857 0355 0000 A        .WORD          0/4       ;     5                           00010853
858 0356 243B A        .WORD      37100/4       ;      6                          00010854
859 0357 0000 A        .WORD          0/4       ;       7                         00010855
860 0358 0000 A        .WORD          0/4       ;        8                        00010856
861 0359 24D1 A        .WORD      37700/4       ;         9                       00010857
862 035A 249F A        .WORD      37500/4       ;          A                      00010858
863 035B 24B8 A        .WORD      37600/4       ;           B                     00010859
864 035C 246D A        .WORD      37300/4       ;            C                    00010860
865 035D 0000 A        .WORD          0/4       ;             D                   00010861
866 035E 2486 A        .WORD      37400/4       ;              E                  00010862
867 035F 0000 A        .WORD          0/4       ;               F                 00010863
868 0360 0000 A        .WORD          0/4       ;0  36 36 36 36 36                00010864
869 0361 21FC A        .WORD      34800/4       ; 1                               00010865
870 0362 222E A        .WORD      35000/4       ;  2                              00010866
871 0363 2215 A        .WORD      34900/4       ;   3                             00010867
872 0364 2260 A        .WORD      35200/4       ;    4                            00010868
873 0365 0000 A        .WORD          0/4       ;     5                           00010869
874 0366 2247 A        .WORD      35100/4       ;      6                          00010870
875 0367 0000 A        .WORD          0/4       ;       7                         00010871
876 0368 0000 A        .WORD          0/4       ;        8                        00010872
877 0369 22DD A        .WORD      35700/4       ;         9                       00010873
878 036A 22AB A        .WORD      35500/4       ;          A                      00010874
879 036B 22C4 A        .WORD      35600/4       ;           B                     00010875
880 036C 2279 A        .WORD      35300/4       ;            C                    00010876
881 036D 0000 A        .WORD          0/4       ;             D                   00010877
882 036E 2292 A        .WORD      35400/4       ;              E                  00010878
883 036F 0000 A        .WORD          0/4       ;               F                 00010879
```

```
884 0370 0000 A        .WORD       0/4        ;0 37 37 37 37 37        00010880
885 0371 23D7 A        .WORD    36700/4        ; 1                     00010881
886 0372 23A5 A        .WORD    36500/4        ;  2                    00010882
887 0373 23BE A        .WORD    36600/4        ;   3                   00010883
888 0374 2373 A        .WORD    36300/4        ;    4                  00010884
889 0375 0000 A        .WORD       0/4        ;     5                  00010885
890 0376 238C A        .WORD    36400/4        ;      6                00010886
891 0377 0000 A        .WORD       0/4        ;       7                00010887
892 0378 0000 A        .WORD       0/4        ;        8               00010888
893 0379 22F6 A        .WORD    35800/4        ;         9             00010889
894 037A 2328 A        .WORD    36000/4        ;          A            00010890
895 037B 230F A        .WORD    35900/4        ;           B           00010891
896 037C 235A A        .WORD    36200/4        ;            C          00010892
897 037D 0000 A        .WORD       0/4        ;             D          00010893
898 037E 2341 A        .WORD    36100/4        ;              E        00010894
899 037F 0000 A        .WORD       0/4        ;               F        00010895
900 0380 0000 A        .WORD       0/4        ;0 38 38 38 38 38        00010896
901 0381 2D9B A        .WORD    46700/4        ; 1                     00010897
902 0382 2D69 A        .WORD    46500/4        ;  2                    00010898
903 0383 2D82 A        .WORD    46600/4        ;   3                   00010899
904 0384 2D37 A        .WORD    46300/4        ;    4                  00010900
905 0385 0000 A        .WORD       0/4        ;     5                  00010901
906 0386 2D50 A        .WORD    46400/4        ;      6                00010902
907 0387 0000 A        .WORD       0/4        ;       7                00010903
908 0388 0000 A        .WORD       0/4        ;        8               00010904
909 0389 2CBA A        .WORD    45800/4        ;         9             00010905
910 038A 2CEC A        .WORD    46000/4        ;          A            00010906
911 038B 2CD3 A        .WORD    45900/4        ;           B           00010907
912 038C 2D1E A        .WORD    46200/4        ;            C          00010908
913 038D 0000 A        .WORD       0/4        ;             D          00010909
914 038E 2D05 A        .WORD    46100/4        ;              E        00010910
915 038F 0000 A        .WORD       0/4        ;               F        00010911
916 0390 0000 A        .WORD       0/4        ;0 39 39 39 39 39        00010912
917 0391 2BC0 A        .WORD    44800/4        ; 1                     00010913
918 0392 2DF2 A        .WORD    45000/4        ;  2                    00010914
919 0393 2BD9 A        .WORD    44900/4        ;   3                   00010915
920 0394 2C24 A        .WORD    45200/4        ;    4                  00010916
921 0395 0000 A        .WORD       0/4        ;     5                  00010917
922 0396 2C0B A        .WORD    45100/4        ;      6                00010918
923 0397 0000 A        .WORD       0/4        ;       7                00010919
924 0398 0000 A        .WORD       0/4        ;        8               00010920
925 0399 2CA1 A        .WORD    45700/4        ;         9             00010921
926 039A 2C6F A        .WORD    45500/4        ;          A            00010922
927 039B 2C88 A        .WORD    45600/4        ;           B           00010923
928 039C 2C3D A        .WORD    45300/4        ;            C          00010924
929 039D 0000 A        .WORD       0/4        ;             D          00010925
930 039E 2C56 A        .WORD    45400/4        ;              E        00010926
931 039F 0000 A        .WORD       0/4        ;               F        00010927
932 03A0 0000 A        .WORD       0/4        ;0 3A 3A 3A 3A 3A        00010928
933 03A1 29CC A        .WORD    42800/4        ; 1                     00010929
934 03A2 29FE A        .WORD    43000/4        ;  2                    00010930
935 03A3 29E5 A        .WORD    42900/4        ;   3                   00010931
936 03A4 2A30 A        .WORD    43200/4        ;    4                  00010932
937 03A5 0000 A        .WORD       0/4        ;     5                  00010933
938 03A6 2A17 A        .WORD    43100/4        ;      6                00010934
939 03A7 0000 A        .WORD       0/4        ;       7                00010935
940 03A8 0000 A        .WORD       0/4        ;        8               00010936
941 03A9 2AAD A        .WORD    43700/4        ;         9             00010937
942 03AA 2A7B A        .WORD    43500/4        ;          A            00010938
943 03AB 2A94 A        .WORD    43600/4        ;           B           00010939
944 03AC 2A49 A        .WORD    43300/4        ;            C          00010940
945 03AD 0000 A        .WORD       0/4        ;             D          00010941
946 03AE 2A62 A        .WORD    43400/4        ;              E        00010942
947 03AF 0000 A        .WORD       0/4        ;               F        00010943
948 03B0 0000 A        .WORD       0/4        ;0 3B 3B 3B 3B 3B        00010944
949 03B1 2BA7 A        .WORD    44700/4        ; 1                     00010945
950 03B2 2B75 A        .WORD    44500/4        ;  2                    00010946
951 03B3 2B8E A        .WORD    44600/4        ;   3                   00010947
952 03B4 2B43 A        .WORD    44300/4        ;    4                  00010948
953 03B5 0000 A        .WORD       0/4        ;     5                  00010949
954 03B6 2B5C A        .WORD    44400/4        ;      6                00010950
955 03B7 0000 A        .WORD       0/4        ;       7                00010951
956 03B8 0000 A        .WORD       0/4        ;        8               00010952
957 03B9 2AC6 A        .WORD    43800/4        ;         9             00010953
958 03BA 2AF8 A        .WORD    44000/4        ;          A            00010954
959 03BB 2ADF A        .WORD    43900/4        ;           B           00010955
960 03BC 2B2A A        .WORD    44200/4        ;            C          00010956
961 03BD 0000 A        .WORD       0/4        ;             D          00010957
```

```
962 03BE 2B11 A       .WORD    44100/4     ;                        E             00010958
963 03BF 0000 A       .WORD        0/4     ;                         F            00010959
964 03C0 0000 A       .WORD        0/4     ;0  3C  3C  3C  3C  3C    00010960
965 03C1 25E4 A       .WORD    38800/4     ;   1                                  00010961
966 03C2 2616 A       .WORD    39000/4     ;    2                                 00010962
967 03C3 25FD A       .WORD    38900/4     ;     3                                00010963
968 03C4 2648 A       .WORD    39200/4     ;      4                               00010964
969 03C5 0000 A       .WORD        0/4     ;       5                              00010965
970 03C6 262F A       .WORD    39100/4     ;        6                             00010966
971 03C7 0000 A       .WORD        0/4     ;         7                            00010967
972 03C8 0000 A       .WORD        0/4     ;          8                           00010968
973 03C9 26C5 A       .WORD    39700/4     ;           9                          00010969
974 03CA 2693 A       .WORD    39500/4     ;            A                         00010970
975 03CB 26AC A       .WORD    39600/4     ;             B                        00010971
976 03CC 2661 A       .WORD    39300/4     ;              C                       00010972
977 03CD 0000 A       .WORD        0/4     ;               D                      00010973
978 03CE 267A A       .WORD    39400/4     ;                E                     00010974
979 03CF 0000 A       .WORD        0/4     ;                 F                    00010975
980 03D0 0000 A       .WORD        0/4     ;0  3D  3D  3D  3D  3D    00010976
981 03D1 27BF A       .WORD    40700/4     ;   1                                  00010977
982 03D2 278D A       .WORD    40500/4     ;    2                                 00010978
983 03D3 27A6 A       .WORD    40600/4     ;     3                                00010979
984 03D4 275B A       .WORD    40300/4     ;      4                               00010980
985 03D5 0000 A       .WORD        0/4     ;       5                              00010981
986 03D6 2774 A       .WORD    40400/4     ;        6                             00010982
987 03D7 0000 A       .WORD        0/4     ;         7                            00010983
988 03D8 0000 A       .WORD        0/4     ;          8                           00010984
989 03D9 26DE A       .WORD    39800/4     ;           9                          00010985
990 03DA 2710 A       .WORD    40000/4     ;            A                         00010986
991 03DB 26F7 A       .WORD    39900/4     ;             B                        00010987
992 03DC 2742 A       .WORD    40200/4     ;              C                       00010988
993 03DD 0000 A       .WORD        0/4     ;               D                      00010989
994 03DE 2729 A       .WORD    40100/4     ;                E                     00010990
995 03DF 0000 A       .WORD        0/4     ;                 F                    00010991
996 03E0 0000 A       .WORD        0/4     ;0  3E  3E  3E  3E  3E    00010992
997 03E1 29B3 A       .WORD    42700/4     ;   1                                  00010993
998 03E2 2981 A       .WORD    42500/4     ;    2                                 00010994
999 03E3 299A A       .WORD    42600/4     ;     3                                00010995
1000 03E4 294F A      .WORD    42300/4     ;      4                               00010996
1001 03E5 0000 A      .WORD        0/4     ;       5                              00010997
1002 03E6 2968 A      .WORD    42400/4     ;        6                             00010998
1003 03E7 0000 A      .WORD        0/4     ;         7                            00010999
1004 03E8 0000 A      .WORD        0/4     ;          8                           00011000
1005 03E9 28D2 A      .WORD    41800/4     ;           9                          00011001
1006 03EA 2904 A      .WORD    42000/4     ;            A                         00011002
1007 03EB 28EB A      .WORD    41900/4     ;             B                        00011003
1008 03EC 2936 A      .WORD    42200/4     ;              C                       00011004
1009 03ED 0000 A      .WORD        0/4     ;               D                      00011005
1010 03EE 291D A      .WORD    42100/4     ;                E                     00011006
1011 03EF 0000 A      .WORD        0/4     ;                 F                    00011007
1012 03F0 0000 A      .WORD        0/4     ;0  3F  3F  3F  3F  3F    00011008
1013 03F1 27D8 A      .WORD    40800/4     ;   1                                  00011009
1014 03F2 280A A      .WORD    41000/4     ;    2                                 00011010
1015 03F3 27F1 A      .WORD    40900/4     ;     3                                00011011
1016 03F4 283C A      .WORD    41200/4     ;      4                               00011012
1017 03F5 0000 A      .WORD        0/4     ;       5                              00011013
1018 03F6 2823 A      .WORD    41100/4     ;        6                             00011014
1019 03F7 0000 A      .WORD        0/4     ;         7                            00011015
1020 03F8 0000 A      .WORD        0/4     ;          8                           00011016
1021 03F9 28B9 A      .WORD    41700/4     ;           9                          00011017
1022 03FA 2887 A      .WORD    41500/4     ;            A                         00011018
1023 03FB 28A0 A      .WORD    41600/4     ;             B                        00011019
1024 03FC 2855 A      .WORD    41300/4     ;              C                       00011020
1025 03FD 0000 A      .WORD        0/4     ;               D                      00011021
1026 03FE 286E A      .WORD    41400/4     ;                E                     00011022
1027 03FF 0000 A      .END         0/4     ;                 F                    00011023
```

TABLE III

| | | | | | | | | | | | | | | | |
|---|---|---|---|---|---|---|---|---|---|---|---|---|---|---|---|
| 0000 | 0000 | 0001 | 0000 | 0002 | FF06 | 0003 | 0000 | 0004 | FF38 | 0005 | 0000 | 0006 | FF1F | 0007 | 0000 |
| 0008 | 0000 | 0009 | FFB5 | 000A | FF83 | 000B | FF9C | 000C | FF51 | 000D | 0000 | 000E | FF6A | 000F | 0000 |
| 0010 | 0000 | 0011 | 00AF | 0012 | 007D | 0013 | 0096 | 0014 | 004B | 0015 | 0000 | 0016 | 0064 | 0017 | 0000 |
| 0018 | 0000 | 0019 | FFCE | 001A | 0000 | 001B | FFE7 | 001C | 0032 | 001D | 0000 | 001E | 0019 | 001F | 0000 |
| 0020 | 0000 | 0021 | 02A3 | 0022 | 0271 | 0023 | 028A | 0024 | 023F | 0025 | 0000 | 0026 | 0258 | 0027 | 0000 |
| 0028 | 0000 | 0029 | 01C2 | 002A | 01F4 | 002B | 01DB | 002C | 0226 | 002D | 0000 | 002E | 020D | 002F | 0000 |
| 0030 | 0000 | 0031 | 00C8 | 0032 | 00FA | 0033 | 00E1 | 0034 | 012C | 0035 | 0000 | 0036 | 0113 | 0037 | 0000 |
| 0038 | 0000 | 0039 | 01A9 | 003A | 0177 | 003B | 0190 | 003C | 0145 | 003D | 0000 | 003E | 015E | 003F | 0000 |

| | | | | | | | | | | | | | | | |
|---|---|---|---|---|---|---|---|---|---|---|---|---|---|---|---|
| 0040 | 0000 | 0041 | 068B | 0042 | 0659 | 0043 | 0672 | 0044 | 0627 | 0045 | 0000 | 0046 | 0640 | 0047 | 0000 |
| 0048 | 0000 | 0049 | 05AA | 004A | 05DC | 004B | 05C3 | 004C | 060E | 004D | 0000 | 004E | 05F5 | 004F | 0000 |
| 0050 | 0000 | 0051 | 04B0 | 0052 | 04E2 | 0053 | 04C9 | 0054 | 0514 | 0055 | 0000 | 0056 | 04FB | 0057 | 0000 |
| 0058 | 0000 | 0059 | 0591 | 005A | 055F | 005B | 0578 | 005C | 052D | 005D | 0000 | 005E | 0546 | 005F | 0000 |
| 0060 | 0000 | 0061 | 02BC | 0062 | 02EE | 0063 | 02D5 | 0064 | 0320 | 0065 | 0000 | 0066 | 0307 | 0067 | 0000 |
| 0068 | 0000 | 0069 | 039D | 006A | 036B | 006B | 0384 | 006C | 0339 | 006D | 0000 | 006E | 0352 | 006F | 0000 |
| 0070 | 0000 | 0071 | 0497 | 0072 | 0465 | 0073 | 047E | 0074 | 0433 | 0075 | 0000 | 0076 | 044C | 0077 | 0000 |
| 0078 | 0000 | 0079 | 03B6 | 007A | 03E8 | 007B | 03CF | 007C | 041A | 007D | 0000 | 007E | 0401 | 007F | 0000 |
| 0080 | 0000 | 0081 | 0E5B | 0082 | 0E29 | 0083 | 0E42 | 0084 | 0DF7 | 0085 | 0000 | 0086 | 0E10 | 0087 | 0000 |
| 0088 | 0000 | 0089 | 0D7A | 008A | 0DAC | 008B | 0D93 | 008C | 0DDE | 008D | 0000 | 008E | 0DC5 | 008F | 0000 |
| 0090 | 0000 | 0091 | 0C80 | 0092 | 0CB2 | 0093 | 0C99 | 0094 | 0CE4 | 0095 | 0000 | 0096 | 0CCB | 0097 | 0000 |
| 0098 | 0000 | 0099 | 0D61 | 009A | 002F | 009B | 0048 | 009C | 0CFD | 009D | 0000 | 009E | 0D16 | 009F | 0000 |
| 00A0 | 0000 | 00A1 | 0A8C | 00A2 | 0ABE | 00A3 | 0AA5 | 00A4 | 0AF0 | 00A5 | 0000 | 00A6 | 0AD7 | 00A7 | 0000 |
| 00A8 | 0000 | 00A9 | 0B6D | 00AA | 0B3B | 00AB | 0B54 | 00AC | 0B09 | 00AD | 0000 | 00AE | 0B22 | 00AF | 0000 |
| 00B0 | 0000 | 00B1 | 0C67 | 00B2 | 0C35 | 00B3 | 0C4E | 00B4 | 0C03 | 00B5 | 0000 | 00B6 | 0C1C | 00B7 | 0000 |
| 00B8 | 0000 | 00B9 | 0B86 | 00BA | 0BB8 | 00BB | 0B9F | 00BC | 0BEA | 00BD | 0000 | 00BE | 0BD1 | 00BF | 0000 |
| 00C0 | 0000 | 00C1 | 06A4 | 00C2 | 0606 | 00C3 | 06DD | 00C4 | 0708 | 00C5 | 0000 | 00C6 | 06EF | 00C7 | 0000 |
| 00C8 | 0000 | 00C9 | 0705 | 00CA | 0753 | 00CB | 076C | 00CC | 0721 | 00CD | 0000 | 00CE | 073A | 00CF | 0000 |
| 00D0 | 0000 | 00D1 | 087F | 00D2 | 0840 | 00D3 | 0066 | 00D4 | 081B | 00D5 | 0000 | 00D6 | 0834 | 00D7 | 0000 |
| 00D8 | 0000 | 00D9 | 079E | 00DA | 07D0 | 00DB | 07B7 | 00DC | 0802 | 00DD | 0000 | 00DE | 07E9 | 00DF | 0000 |
| 00E0 | 0000 | 00E1 | 0A73 | 00E2 | 0A41 | 00E3 | 0A5A | 00E4 | 0A0F | 00E5 | 0000 | 00E6 | 0A28 | 00E7 | 0000 |
| 00E8 | 0000 | 00E9 | 0992 | 00EA | 09C4 | 00EB | 09AD | 00EC | 09F6 | 00ED | 0000 | 00EE | 09DD | 00EF | 0000 |
| 00F0 | 0000 | 00F1 | 0898 | 00F2 | 08CA | 00F3 | 08D1 | 00F4 | 08FC | 00F5 | 0000 | 00F6 | 08E3 | 00F7 | 0000 |
| 00F8 | 0000 | 00F9 | 0979 | 00FA | 0947 | 00FB | 0960 | 00FC | 0915 | 00FD | 0000 | 00FE | 092E | 00FF | 0000 |
| 0100 | 0000 | 0101 | 1DFB | 0102 | 1DC9 | 0103 | 1DE2 | 0104 | 1D97 | 0105 | 0000 | 0106 | 1DB0 | 0107 | 0000 |
| 0108 | 0000 | 0109 | 1D1A | 010A | 1D4C | 010B | 1D33 | 010C | 1D7E | 010D | 0000 | 010E | 1D65 | 010F | 0000 |
| 0110 | 0000 | 0111 | 1C20 | 0112 | 1C52 | 0113 | 1C39 | 0114 | 1C84 | 0115 | 0000 | 0116 | 1C6B | 0117 | 0000 |
| 0118 | 0000 | 0119 | 1D01 | 011A | 1CCF | 011B | 1CE8 | 011C | 1C9D | 011D | 0000 | 011E | 1CB6 | 011F | 0000 |
| 0120 | 0000 | 0121 | 1A2C | 0122 | 1A5E | 0123 | 1A45 | 0124 | 1A90 | 0125 | 0000 | 0126 | 1A77 | 0127 | 0000 |
| 0128 | 0000 | 0129 | 1B0D | 012A | 1ADB | 012B | 1AF4 | 012C | 1AA9 | 012D | 0000 | 012E | 1AC2 | 012F | 0000 |
| 0130 | 0000 | 0131 | 1C07 | 0132 | 1BD5 | 0133 | 1BEE | 0134 | 1BA3 | 0135 | 0000 | 0136 | 1BBC | 0137 | 0000 |
| 0138 | 0000 | 0139 | 1B26 | 013A | 1B58 | 013B | 1B3F | 013C | 1B8A | 013D | 0000 | 013E | 1B71 | 013F | 0000 |
| 0140 | 0000 | 0141 | 1644 | 0142 | 1676 | 0143 | 165D | 0144 | 16A8 | 0145 | 0000 | 0146 | 168F | 0147 | 0000 |
| 0148 | 0000 | 0149 | 1725 | 014A | 16F3 | 014B | 170C | 014C | 16C1 | 014D | 0000 | 014E | 16DA | 014F | 0000 |
| 0150 | 0000 | 0151 | 181F | 0152 | 17ED | 0153 | 1806 | 0154 | 17BB | 0155 | 0000 | 0156 | 17D4 | 0157 | 0000 |
| 0158 | 0000 | 0159 | 173E | 015A | 1770 | 015B | 1757 | 015C | 17A2 | 015D | 0000 | 015E | 1789 | 015F | 0000 |
| 0160 | 0000 | 0161 | 1A13 | 0162 | 19E1 | 0163 | 19FA | 0164 | 19AF | 0165 | 0000 | 0166 | 19C8 | 0167 | 0000 |
| 0168 | 0000 | 0169 | 1932 | 016A | 1964 | 016B | 194B | 016C | 1996 | 016D | 0000 | 016E | 197D | 016F | 0000 |
| 0170 | 0000 | 0171 | 1838 | 0172 | 186A | 0173 | 1851 | 0174 | 189C | 0175 | 0000 | 0176 | 1883 | 0177 | 0000 |
| 0178 | 0000 | 0179 | 1919 | 017A | 18E7 | 017B | 1900 | 017C | 18B5 | 017D | 0000 | 017E | 18CE | 017F | 0000 |
| 0180 | 0000 | 0181 | 0E74 | 0182 | 0EA6 | 0183 | 0E8D | 0184 | 0ED8 | 0185 | 0000 | 0186 | 0EBF | 0187 | 0000 |
| 0188 | 0000 | 0189 | 0F55 | 018A | 0F23 | 018B | 0F3C | 018C | 0EF1 | 018D | 0000 | 018E | 0F0A | 018F | 0000 |
| 0190 | 0000 | 0191 | 104F | 0192 | 101D | 0193 | 1036 | 0194 | 0FEB | 0195 | 0000 | 0196 | 1004 | 0197 | 0000 |
| 0198 | 0000 | 0199 | 0F6E | 019A | 0FA0 | 019B | 0F87 | 019C | 0FD2 | 019D | 0000 | 019E | 0FB9 | 019F | 0000 |
| 01A0 | 0000 | 01A1 | 1243 | 01A2 | 1211 | 01A3 | 122A | 01A4 | 11DF | 01A5 | 0000 | 01A6 | 11F8 | 01A7 | 0000 |
| 01A8 | 0000 | 01A9 | 1162 | 01AA | 1194 | 01AB | 117B | 01AC | 11C6 | 01AD | 0000 | 01AE | 11AD | 01AF | 0000 |
| 01B0 | 0000 | 01B1 | 1068 | 01B2 | 109A | 01B3 | 1081 | 01B4 | 10CC | 01B5 | 0000 | 01B6 | 10B3 | 01B7 | 0000 |
| 01B8 | 0000 | 01B9 | 1149 | 01BA | 1117 | 01BB | 1130 | 01BC | 10E5 | 01BD | 0000 | 01BE | 10FE | 01BF | 0000 |
| 01C0 | 0000 | 01C1 | 162B | 01C2 | 15F9 | 01C3 | 1612 | 01C4 | 15C7 | 01C5 | 0000 | 01C6 | 15E0 | 01C7 | 0000 |
| 01C8 | 0000 | 01C9 | 154A | 01CA | 157C | 01CB | 1563 | 01CC | 15AE | 01CD | 0000 | 01CE | 1595 | 01CF | 0000 |
| 01D0 | 0000 | 01D1 | 1450 | 01D2 | 1482 | 01D3 | 1469 | 01D4 | 14B4 | 01D5 | 0000 | 01D6 | 149B | 01D7 | 0000 |
| 01D8 | 0000 | 01D9 | 1531 | 01DA | 14FF | 01DB | 1518 | 01DC | 14CD | 01DD | 0000 | 01DE | 14E6 | 01DF | 0000 |
| 01E0 | 0000 | 01E1 | 125E | 01E2 | 128E | 01E3 | 1275 | 01E4 | 12C0 | 01E5 | 0000 | 01E6 | 12A7 | 01E7 | 0000 |
| 01E8 | 0000 | 01E9 | 133D | 01EA | 130B | 01EB | 1324 | 01EC | 12D9 | 01ED | 0000 | 01EE | 12F2 | 01EF | 0000 |
| 01F0 | 0000 | 01F1 | 1437 | 01F2 | 1405 | 01F3 | 141E | 01F4 | 13D3 | 01F5 | 0000 | 01F6 | 13EC | 01F7 | 0000 |
| 01F8 | 0000 | 01F9 | 1356 | 01FA | 1388 | 01FB | 136F | 01FC | 13BA | 01FD | 0000 | 01FE | 13A1 | 01FF | 0000 |
| 0200 | 0000 | 0201 | 3D3B | 0202 | 3D09 | 0203 | 3D22 | 0204 | 3CD7 | 0205 | 0000 | 0206 | 3CF0 | 0207 | 0000 |
| 0208 | 0000 | 0209 | 3C5A | 020A | 3C8C | 020B | 3C73 | 020C | 3CBE | 020D | 0000 | 020E | 3CA5 | 020F | 0000 |
| 0210 | 0000 | 0211 | 3B60 | 0212 | 3B92 | 0213 | 3B79 | 0214 | 3BC4 | 0215 | 0000 | 0216 | 3BAB | 0217 | 0000 |
| 0218 | 0000 | 0219 | 3C41 | 021A | 3C0F | 021B | 3C28 | 021C | 3BDD | 021D | 0000 | 021E | 3BF6 | 021F | 0000 |
| 0220 | 0000 | 0221 | 396C | 0222 | 399E | 0223 | 3985 | 0224 | 39D0 | 0225 | 0000 | 0226 | 39B7 | 0227 | 0000 |
| 0228 | 0000 | 0229 | 3A4D | 022A | 3A1B | 022B | 3A34 | 022C | 39E9 | 022D | 0000 | 022E | 3A02 | 022F | 0000 |
| 0230 | 0000 | 0231 | 3B47 | 0232 | 3B15 | 0233 | 3B2E | 0234 | 3AE3 | 0235 | 0000 | 0236 | 3AFC | 0237 | 0000 |
| 0238 | 0000 | 0239 | 3A66 | 023A | 3A98 | 023B | 3A7F | 023C | 3ACA | 023D | 0000 | 023E | 3AB1 | 023F | 0000 |
| 0240 | 0000 | 0241 | 3584 | 0242 | 35B6 | 0243 | 359D | 0244 | 35E8 | 0245 | 0000 | 0246 | 35CF | 0247 | 0000 |
| 0248 | 0000 | 0249 | 3665 | 024A | 3633 | 024B | 364C | 024C | 3601 | 024D | 0000 | 024E | 361A | 024F | 0000 |
| 0250 | 0000 | 0251 | 375F | 0252 | 372D | 0253 | 3746 | 0254 | 36FB | 0255 | 0000 | 0256 | 3714 | 0257 | 0000 |
| 0258 | 0000 | 0259 | 367E | 025A | 36B0 | 025B | 3697 | 025C | 36E2 | 025D | 0000 | 025E | 36C9 | 025F | 0000 |
| 0260 | 0000 | 0261 | 3953 | 0262 | 3921 | 0263 | 393A | 0264 | 38EF | 0265 | 0000 | 0266 | 3908 | 0267 | 0000 |
| 0268 | 0000 | 0269 | 3872 | 026A | 38A4 | 026B | 388B | 026C | 38D6 | 026D | 0000 | 026E | 38BD | 026F | 0000 |
| 0270 | 0000 | 0271 | 3778 | 0272 | 37AA | 0273 | 3791 | 0274 | 37DC | 0275 | 0000 | 0276 | 37C3 | 0277 | 0000 |
| 0278 | 0000 | 0279 | 3859 | 027A | 3827 | 027B | 3840 | 027C | 37F5 | 027D | 0000 | 027E | 380E | 027F | 0000 |
| 0280 | 0000 | 0281 | 2DB4 | 0282 | 2DE6 | 0283 | 2DCD | 0284 | 2E18 | 0285 | 0000 | 0286 | 2DFF | 0287 | 0000 |
| 0288 | 0000 | 0289 | 2E95 | 028A | 2E63 | 028B | 2E7C | 028C | 2E31 | 028D | 0000 | 028E | 2E4A | 028F | 0000 |
| 0290 | 0000 | 0291 | 2F8F | 0292 | 2F5D | 0293 | 2F76 | 0294 | 2F2B | 0295 | 0000 | 0296 | 2F44 | 0297 | 0000 |
| 0298 | 0000 | 0299 | 2EAE | 029A | 2EE0 | 029B | 2EC7 | 029C | 2F12 | 029D | 0000 | 029E | 2EF9 | 029F | 0000 |
| 02A0 | 0000 | 02A1 | 3183 | 02A2 | 3151 | 02A3 | 316A | 02A4 | 311F | 02A5 | 0000 | 02A6 | 3138 | 02A7 | 0000 |
| 02A8 | 0000 | 02A9 | 30A2 | 02AA | 30D4 | 02AB | 30BB | 02AC | 3106 | 02AD | 0000 | 02AE | 30ED | 02AF | 0000 |
| 02B0 | 0000 | 02B1 | 2FA8 | 02B2 | 2FDA | 02B3 | 2FC1 | 02B4 | 300C | 02B5 | 0000 | 02B6 | 2FF3 | 02B7 | 0000 |
| 02B8 | 0000 | 02B9 | 3089 | 02BA | 3057 | 02BB | 3070 | 02BC | 3025 | 02BD | 0000 | 02BE | 303E | 02BF | 0000 |
| 02C0 | 0000 | 02C1 | 356B | 02C2 | 3539 | 02C3 | 3552 | 02C4 | 3507 | 02C5 | 0000 | 02C6 | 3520 | 02C7 | 0000 |
| 02C8 | 0000 | 02C9 | 348A | 02CA | 34BC | 02CB | 34A3 | 02CC | 34EE | 02CD | 0000 | 02CE | 34D5 | 02CF | 0000 |
| 02D0 | 0000 | 02D1 | 3390 | 02D2 | 33C2 | 02D3 | 33A9 | 02D4 | 33F4 | 02D5 | 0000 | 02D6 | 33DB | 02D7 | 0000 |
| 02D8 | 0000 | 02D9 | 3471 | 02DA | 343F | 02DB | 3458 | 02DC | 340D | 02DD | 0000 | 02DE | 3426 | 02DF | 0000 |
| 02E0 | 0000 | 02E1 | 319C | 02E2 | 31CE | 02E3 | 31B5 | 02E4 | 3200 | 02E5 | 0000 | 02E6 | 31E7 | 02E7 | 0000 |
| 02E8 | 0000 | 02E9 | 3270 | 02EA | 324B | 02EB | 3264 | 02EC | 3219 | 02ED | 0000 | 02EE | 3232 | 02EF | 0000 |
| 02F0 | 0000 | 02F1 | 3377 | 02F2 | 3345 | 02F3 | 335E | 02F4 | 3313 | 02F5 | 0000 | 02F6 | 332C | 02F7 | 0000 |

| | | | | | | | | | | | | | | | |
|---|---|---|---|---|---|---|---|---|---|---|---|---|---|---|---|
| 02F8 | 0000 | 02F9 | 3296 | 02FA | 32C8 | 02FB | 32AF | 02FC | 32FA | 02FD | 0000 | 02FE | 32E1 | 02FF | C000 |
| 0300 | 0000 | 0301 | 1E14 | 0302 | 1E46 | 0303 | 1E2D | 0304 | 1E78 | 0305 | 0000 | 0306 | 1E5F | 0307 | 0000 |
| 0308 | 0000 | 0309 | 1EF5 | 030A | 1EC3 | 030B | 1EDC | 030C | 1E91 | 030D | 0000 | 030E | 1EAA | 030F | 0000 |
| 0310 | 0000 | 0311 | 1FEF | 0312 | 1FBD | 0313 | 1FD6 | 0314 | 1F8B | 0315 | 0000 | 0316 | 1FA4 | 0317 | 0000 |
| 0318 | 0000 | 0319 | 1F0E | 031A | 1F40 | 031B | 1F27 | 031C | 1F72 | 031D | 0000 | 031E | 1F59 | 031F | 0000 |
| 0320 | 0000 | 0321 | 21E3 | 0322 | 21B1 | 0323 | 21CA | 0324 | 217F | 0325 | 0000 | 0326 | 2198 | 0327 | 0000 |
| 0328 | 0000 | 0329 | 2102 | 032A | 2134 | 032B | 211B | 032C | 2166 | 032D | 0000 | 032E | 2140 | 032F | 0000 |
| 0330 | 0000 | 0331 | 2008 | 0332 | 203A | 0333 | 2021 | 0334 | 206C | 0335 | 0000 | 0336 | 2053 | 0337 | 0000 |
| 0338 | 0000 | 0339 | 20E9 | 033A | 20B7 | 033B | 20D0 | 033C | 2085 | 033D | 0000 | 033E | 209E | 033F | 0000 |
| 0340 | 0000 | 0341 | 25CB | 0342 | 2599 | 0343 | 25B2 | 0344 | 2567 | 0345 | 0000 | 0346 | 2580 | 0347 | 0000 |
| 0348 | 0000 | 0349 | 24EA | 034A | 251C | 034B | 2503 | 034C | 254E | 034D | 0000 | 034E | 2535 | 034F | 0000 |
| 0350 | 0000 | 0351 | 23F0 | 0352 | 2422 | 0353 | 2409 | 0354 | 2454 | 0355 | 0000 | 0356 | 243B | 0357 | 0000 |
| 0358 | 0000 | 0359 | 24D1 | 035A | 249F | 035B | 24B8 | 035C | 246D | 035D | 0000 | 035E | 2486 | 035F | 0000 |
| 0360 | 0000 | 0361 | 21FC | 0362 | 222E | 0363 | 2215 | 0364 | 2260 | 0365 | 0000 | 0366 | 2247 | 0367 | 0000 |
| 0368 | 0000 | 0369 | 22DD | 036A | 22AB | 036B | 22C4 | 036C | 2279 | 036D | 0000 | 036E | 2292 | 036F | 0000 |
| 0370 | 0000 | 0371 | 23D7 | 0372 | 23A5 | 0373 | 23BE | 0374 | 2373 | 0375 | 0000 | 0376 | 238C | 0377 | 0000 |
| 0378 | 0000 | 0379 | 22F6 | 037A | 2328 | 037B | 230F | 037C | 235A | 037D | 0000 | 037E | 2341 | 037F | 0000 |
| 0380 | 0000 | 0381 | 2D9B | 0382 | 2D69 | 0383 | 2D82 | 0384 | 2D37 | 0385 | 0000 | 0386 | 2D50 | 0387 | 0000 |
| 0388 | 0000 | 0389 | 2CBA | 038A | 2CEC | 038B | 2CD3 | 038C | 2D1E | 038D | 0000 | 038E | 2D05 | 038F | 0000 |
| 0390 | 0000 | 0391 | 2BC0 | 0392 | 2BF2 | 0393 | 2BD9 | 0394 | 2C24 | 0395 | 0000 | 0396 | 2C0B | 0397 | 0000 |
| 0398 | 0000 | 0399 | 2CA1 | 039A | 2C6F | 039B | 2C88 | 039C | 2C3D | 039D | 0000 | 039E | 2C56 | 039F | 0000 |
| 03A0 | 0000 | 03A1 | 29CC | 03A2 | 29FE | 03A3 | 29E5 | 03A4 | 2A30 | 03A5 | 0000 | 03A6 | 2A17 | 03A7 | 0000 |
| 03A8 | 0C00 | 03A9 | 2AAD | 03AA | 2A7B | 03AB | 2A94 | 03AC | 2A49 | 03AD | 0000 | 03AE | 2A62 | 03AF | 0000 |
| 03B0 | 0000 | 03B1 | 2BA7 | 03B2 | 2B75 | 03B3 | 2B8E | 03B4 | 2B43 | 03B5 | 0000 | 03B6 | 2B5C | 03B7 | 0000 |
| 03B8 | 0000 | 03B9 | 2AC6 | 03BA | 2AF8 | 03BB | 2ADF | 03BC | 2D2A | 03BD | 0000 | 03BE | 2B11 | 03BF | 0000 |
| 03C0 | 0000 | 03C1 | 25E4 | 03C2 | 2616 | 03C3 | 25FD | 03C4 | 2648 | 03C5 | 0000 | 03C6 | 262F | 03C7 | 0000 |
| 03C8 | 0000 | 03C9 | 26C5 | 03CA | 2693 | 03CB | 26AC | 03CC | 2661 | 03CD | 0000 | 03CE | 267A | 03CF | 0000 |
| 03D0 | 0000 | 03D1 | 27BF | 03D2 | 278D | 03D3 | 27A6 | 03D4 | 275B | 03D5 | 0000 | 03D6 | 2774 | 03D7 | 0000 |
| 03D8 | 0000 | 03D9 | 26DE | 03DA | 2710 | 03DB | 26F7 | 03DC | 2742 | 03DD | 0000 | 03DE | 2729 | 03DF | 0000 |
| 03E0 | 0000 | 03E1 | 29B3 | 03E2 | 2981 | 03E3 | 299A | 03E4 | 294F | 03E5 | 0000 | 03E6 | 2968 | 03E7 | 0000 |
| 03E8 | 0000 | 03E9 | 2802 | 03EA | 2904 | 03EB | 28EB | 03EC | 2936 | 03ED | 0000 | 03EE | 2910 | 03EF | 0000 |
| 03F0 | 0000 | 03F1 | 27D8 | 03F2 | 280A | 03F3 | 27F1 | 03F4 | 283C | 03F5 | 0000 | 03F6 | 2823 | 03F7 | 0000 |
| 03F8 | 0000 | 03F9 | 28B9 | 03FA | 2887 | 03FB | 28A0 | 03FC | 2855 | 03FD | 0000 | 03FE | 286E | | |

Each adjusted parallel signal 36, having bit signals 36A to 36I, of FIG. 3 addresses one memory location and causes parallel signal 46, having sixteen bit signals 46A to 46P, to be output from memory device 44.

In order to accomplish this code conversion, four 5204 EPROMs having 512 words each with an 8 bit length are provided. To produce the sixteen bit word, two EPROMs of 8 bit words are wired into adjusted parallel signal 36 as shown in FIG. 3. The other two are similarly wired. Depending on adjusted bit signal 36J which changes value upon the altimeter reaching a given altitude, a first group of ROMs such as 50 and 52 are selected by memory select device 42.

Analogous procedures can be used to change a first code to a second code by use of a memory device having an addressable table therein.

It should be understood that although EPROMs were used for this particular embodiment, other memory devices such as PROMs or ROMs are available for such depending on the production level required.

To determine whether the first group, consisting of ROMs 50 and 52, or the second group of ROMs shown in FIG. 3, is used for the code conversion, a memory select device 42 receives a chip select signal (CS) 142, adjusted bit signal 36J, and a preset signal 118 (VH1). Referring also to FIG. 9 which illustrates various data control signals, CS signal 142 is high during the last two cycles of a five cycle control period 154. VH1 signal 118 is high after the converter is powered up. Thus depending on adjusted bit signal 36J which changes value when an altitude threshold is crossed one group or the other is selected. For example, if bit signal 36J is high, ROMs 50 and 52 output sixteen bits of parallel signal 46 of binary code. ROM 52 outputs eight bits of binary code data, the first eight bits of sixteen bit signal 46, 46A to 46H binary bit signals, and ROM 50 outputs the second eight bits of sixteen bit signal 46, 46I to 46P binary bit signals. If and when bit signal 36J changes to a low signal, the other pair of ROMs output binary parallel signal 46. Two ROMs are required in each group since each ROM has only 512 memory addresses but over 600 addresses are required for the code conversion. Increasing the bit length of parallel signal 46 requires ROMs of larger word length, for example 16 bits to make a 32 bit parallel signal 46. Also additional ROMs can be added if adjusted signal parallel 36 has more parallel bits than ten as occurred in this example.

Data conversion device 56, FIG. 4, converts sixteen binary bits of parallel binary signal 46 to thirty-two binary bits of serial binary signal 64. Parallel signal 46, having binary bit signals 46A to 46P, is input to a shift register device 58. In this particular embodiment four, 74165 shift registers 58A to 58D having 8 parallel inputs each and connected in series for outputting a non-parity serial binary signal 62.

The format of non-parity serial signal 62 is controlled by shift register device 58. The first eight bits identifies the sending device, i.e. altimeter code converter; the next four bits are blank; the next nineteen bits contain the binary data with three blank bits; and the last bit is for a parity signal to be inserted by a parity generator 50. This particular format is required by the Delco III Carousel computer. Other data formats are equally possible by grounding certain inputs of shift registers 58A to 58D.

Referring to FIG. 4, sixteen bit parallel signal 46 is input into shift register device 58 along with VH1 signal 118, being a constant high from power-up of the converter; also input is a data clock signal (CLK) 134 which is used to shift the bits out of register 58; and input also is a load signal 144 (LOAD) used to enable the parallel inputs of register 58 or to enable the serial output, this signal going low one cycle before a data shift period 156, FIG. 9, to enable the serial output. After the serial output is enabled, thirty-two high-low cycles of CLK signal 134 shift the data out of register 58 as non-parity serial signal 62 in the format noted above. The address of the device is wired into the first shift register in the line of four. Of course, more or less shift registers can be used depending on the input and output signals.

Computer 108, being only one type of data processing device, requires input signal and formats to be of a particular form. In this embodiment, a Delco Carousel IV Computer requires that the serial data input be of odd parity, i.e. the number of "1's" transmitted during the thirty-two cycles data shift period 156 be odd in number. This is accomplished by a parity generator 50. Generator 50 inserts a "1" into the 32nd bit position of serial signal 62 as determined by generator 50.

This is accomplished by shift register 58 transmitting a serial signal 62 to a NAND gate 66 which toggles a 7474 D-type flip-flop 70 upon each high data pulse allowed to pass through gate 66 by a data gating signal 136 (DGATE), FIG. 4. A timing signal 138 ($\overline{X6}$), being high during control period 154 and a voltage failure signal 152 (VFAIL) are input to a NAND gate 72 which resets flip-flop 70 before data period 156. VFAIL signal 152 and $\overline{X6}$ signal 138 are input to a NAND gate 76. If VFAIL signal 152 goes high, indicating a voltage failure in the power supply, flip-flop 70 is set to insert an even parity in the data stream. If the parity of the serial data is odd, a high is placed at an output 78 of flip-flop 70. If even, a low is output. This toggling action results from the input signals to NAND gate 66.

Before the 32nd bit is transmitted by parity generator 50, a parity signal 140 is normally high and only goes low during the 32nd bit cycle, as shown in FIG. 9. A high parity signal 140 is inverted and inhibits output 78 at gate 75 and also causes a constant high at an input 80 of a NAND gate 74. The high parity signal 140 applied to a NAND gate 68 allows signal 62 to be applied at an input 84 of NAND gate 74 inverted. Since input 80 is high, signal 62 appears correctly at an output 82.

The odd parity of signal 62 is inserted in the 32nd bit position by means of output 78 from parity flip-flop 70. A low parity signal 140, occurring at the 32nd bit cycle, causes a high at input 84. The low parity signal is inverted and places a high at the input of gate 75. This allows the parity generated signal 78 to pass through gates 75 and 74, thus inserting the proper parity in the 32nd bit position. This completes the formation of thirty-two bit serial binary signal 64 acceptable in format.

As to the Delco Carousel IV computer, thirty-two bit adjusted serial signal 99 is transmitted over a two wire (twisted and shielded pair) circuit. It must be a return to zero system so that if no data is being transmitted both lines will remain at zero volts. The waveform must exhibit a voltage level transition at the beginning of each data bit and return to zero in the middle of the bit cycle. A blank consisting of zero volts on both lines for a minimum of four cycles must exist between data words transmitted by the altimeter code converter. This period, control period 154 in FIG. 9, provides the necessary synchronization for the receiving equipment and provides the five cycles of time needed for setup of a data control device 122. Output data interface 86 provides for the above requirement.

Referring to FIG. 5, this format is obtained by output data interface 86 using a signal adjusting device 88 and an output driver 90.

As a result of inputting 32 binary bits of serial signal 64 and a timing signal (DGATE) 136 for passing data which replicates CLK signal 134 during data period 156, a Y signal 96 and an X signal 98 are output as noted in Table 2.

TABLE IV

|  | HIGH DGATE |
|---|---|
| High Bin. Sig. | Y = 0 |
|  | X = 0 |
| Low Bin. Sig. | Y = 5 |
|  | X = 5 |

The data bits of signal 64 are clocked out of data conversion device 56 at the same rate as DGATE signal 136 changes. When binary signal 64 and DGATE are high, X signal 98 and Y signal 96 are both low. X signal 98 and Y signal 96 are the compliment when DGATE is low. When binary signal 64 is low and DGATE is high, X and Y signals are both high.

As to output driver 90, X signal 98 and Y signal 96 are applied to output driver 90, shown in FIG. 5, and as a result an adjusted serial signal 99 composed of a B driver signal 102 and an A driver signal 104 changes in relation to X and Y signals are noted in Table V.

TABLE V

| INPUTS | | OUTPUTS | |
|---|---|---|---|
| X | Y | A | B |
| 0V | 0V | −5V | +5V |
| 0V | 5V | 0V | 0V |
| 5V | 0V | 0V | 0V |
| 5V | 5V | +5V | −5V |

Two operational amplifiers 92 and 94, of the type LH0041G, are used to accomplish this result. CMOS devices are used in output driver 90 to insure the proper voltage levels to computer 108. For example, if X signal is 5 volts and Y signal is 0 volts, a voltage 100 is less than zero because of a voltage divider therein. The voltage output of amplifier 92 is 0 volts (ground) in this case. When both X and Y signals are 5 or 0 volts, B and A signal are as noted in Table V thus satisfying the signal input requirements to the Delco Carousel IV Computer.

FIG. 6 illustrates two type of preset devices 114 and 116 for outputting 2 high level initializing signals 118 (VH1) and 120 (VH2) after power-up of the converter.

FIG. 7 illustrates data control device 122. A computer strobe signal 109 of 9600 HZ is applied to a clock strobe signal device 128 of an operational amplifier 130 which adjusts the computer strobe 109 to a clock strobe signal 132 of a proper voltage level. Clock strobe signal 132 is a 9600 HZ signal as noted in FIG. 9.

Clock strobe signal 132 is applied to two 74163 counters 124. Counters 124 output various counting signals 124 A,B,C,D,E,F, and G (X1, X2, X3, X4, X5, X6, and X7 respectively) which are input to a timing signal generator 126 that combines the counting signals to form timing signals as illustrated in FIG. 9 and noted in the above disussion to control the flow of data through the altimeter code converter.

FIG. 8 illustrates power means 146 and is composed of a power supply 148 having an input voltage of 115 VAC. In this particular embodiment, a 115 VAC supply is available in the aircraft; otherwise the aircraft 28 volt supply is used to obtain the necessary regulated voltage. A model MPI-750/212-100 Modular Encapsulated Power Supply is used to obtain the proper regulated voltages.

If the aircraft's 28 volt supply failed, computer 108 was informed of this fact which alarmed personnel to disregard data because of a power failure. A power failure device 150, shown in FIG. 8, sends high signal 152 (VFAIL) if the 28 volt supply fails. VFAIL signal 152 is input to parity generator 50 which causes an even parity to be formed causing the computer to disregard the data sent. Referring to FIG. 2, two voltages +28 V and +12 V are applied through diodes 30 and 32. This insures that if the 28 V aircraft system failed, strobe signal 109 is able to operate clock strobe device 128 and send data to the carousel computer. A failure would be noted by the computer since VFAIL signal 152 goes high and is still sent to the computer.

MODE OF OPERATION

In operation, a parallel signal 16 of Gray code data is sent by altimeter 14 to input data interface 18. An adjusted parallel signal 36 is output to code conversion device 38 that converts the Gray code to binary code. A parallel signal 46 of binary code is output by code conversion device 38. Data conversion device 56 changes parallel signal 46 to serial signal 64 of the proper format. Output data interface 86 adjusts serial binary signal 64 to be compatible with Delco Carousel IV Computer 61 requiring input data to be in the Digital Air Data System Code (DADS)

It is to be noted that although there have been described the fundamental and unique features of my invention as applied to a preferred embodiment, various other embodiments, variations, adaptations, substitutions, additions, omissions, and the like may occur to, and can be made by, those of ordinary skill in the art, without departing from the spirit of the invention.

What is claimed is:

1. An altitude code converter that has input a parallel signal being Gray coded for altitude information and that outputs a binary serial word acceptable to a computer comprising:

an input data interface connected for receiving the altitude information coded parallel signal and connected for outputting an adjusted parallel signal having a plurality of adjusted bit signals, said input data interface having a plurality of adjusting circuits equal in number to the number of bit signals of the parallel signal, each of said adjusting circuits having buffer amplifying means therein;

a conversion device connected for receiving the adjusted parallel signal output from said input data interface and connected for outputting a binary serial signal, said conversion device including a code conversion circuit for converting the adjusted parallel signal to a binary parallel signal representing actual altitude in binary notation, said code conversion circuit being memory means having a lookup table therein, said memory means addressed by a plurality of said adjusted bit signals and outputting a 16 bit binary parallel signal having a decimal equivalent value of an altitude input to said altitude code converter in Gray code, and a memory select circuit connected for selecting read-only memories to be addressed; a data conversion circuit for receiving the binary parallel signal and outputting a binary serial signal having a predetermined bit length and having a parity bit inserted therein, said data conversion circuit including at least one parallel-to-serial shift register for outputting a 32 bit serial signal without parity and a parity generator connected for inserting a parity bit into said 32 bit serial signal; and a data control circuit for outputting timing signals to said code conversion circuit and said data conversion circuit, said data control circuit including a pair of counters connected for having input initializing signals from said condition present circuit and a strobe signal from said computer and outputting a plurality of counting signals to a timing signal generator comprising a plurality of gates and inverters, said timing signal generator outputting a clock signal, a data gating signal during a data shift period, a data enable signal, a parity signal, a chip select signal, and a load signal;

an output data interface connected for receiving the binary serial signal and for outputting said binary serial computer word;

a condition preset circuit connected for initializing said conversion device;

means for powering, said means for powering including a circuit connected for providing a plurality of fixed voltages to said code converter and a circuit connected for indicating external power failure to said conversion device.

2. An altitude code converter that has input a parallel signal being Gray coded for altitude information and that outputs a binary serial word acceptable to a computer as defined in claim 1 wherein said buffer amplifying means further includes one of said bit signals applied to a first diode, said first diode connected to a negative input of an operational amplifier through a first resistor, a first positive voltage connected to a positive input of said operational amplifier, a second positive voltage applied to said first resistor through a voltage divider network, said first and second voltages driving said operational amplifier through diodes, and a pullup resistor connected to the output of said operational amplifier with a third voltage applied thereon.

3. An altitude code converter that has input a parallel signal being Gray coded for altitude information and that outputs a binary serial word acceptable to a computer as defined in claim 1 wherein said parity generator includes:

a first gate connected for inserting parity in case of voltage failure having input a power failure signal and a data shift signal, a second gate connected for toggling having input said 32 bit serial signal and a data gating signal, a third gate connected for resetting having input the inverse of the power failure signal and the data shift signal, and a flip-flop circuit having input outputs of said first, second and third gates, said flip-flop connected for outputting a parity bit if said 31 bit serial signal is odd.

* * * * *